(12) United States Patent
Uchida et al.

(10) Patent No.: US 10,730,316 B2
(45) Date of Patent: Aug. 4, 2020

(54) LIGHT EMITTING THYRISTOR HAVING A PLURALITY OF SEMICONDUCTOR LAYERS WITH A SPECIFIC LAYER HAVING THE SMALLEST BANDGAP, LIGHT EMITTING THYRISTOR ARRAY, EXPOSURE HEAD, AND IMAGE FORMING DEVICE

(71) Applicant: CANON KABUSHIKI KAISHA, Tokyo (JP)

(72) Inventors: Takeshi Uchida, Hiratsuka (JP); Takako Suga, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 16/121,919

(22) Filed: Sep. 5, 2018

(65) Prior Publication Data
US 2019/0070864 A1 Mar. 7, 2019

(30) Foreign Application Priority Data

Sep. 7, 2017 (JP) .................. 2017-172341
Jul. 20, 2018 (JP) .................. 2018-136477

(51) Int. Cl.
| | | |
|---|---|---|
| B41J 2/455 | (2006.01) |
| B41J 2/44 | (2006.01) |
| G03G 15/04 | (2006.01) |
| H01L 33/14 | (2010.01) |
| H01L 33/36 | (2010.01) |
| H01L 33/02 | (2010.01) |
| H01L 33/06 | (2010.01) |
| H01L 33/00 | (2010.01) |
| H01L 33/38 | (2010.01) |

(52) U.S. Cl.
CPC ............... *B41J 2/455* (2013.01); *B41J 2/44* (2013.01); *G03G 15/04* (2013.01); *G03G 15/04036* (2013.01); *H01L 33/02* (2013.01); *H01L 33/14* (2013.01); *H01L 33/36* (2013.01); *H01L 33/0016* (2013.01); *H01L 33/06* (2013.01); *H01L 33/38* (2013.01)

(58) Field of Classification Search
CPC combination set(s) only.
See application file for complete search history.

(56) References Cited

U.S. PATENT DOCUMENTS

| | | |
|---|---|---|
| 7,796,662 B2 | 9/2010 | Uchida et al. |
| 7,839,913 B2 | 11/2010 | Uchida et al. |
| 7,869,483 B2 | 1/2011 | Uchida et al. |
| 8,149,892 B2 | 4/2012 | Nagatomo et al. |

(Continued)

FOREIGN PATENT DOCUMENTS

JP 201365591 A 4/2013

*Primary Examiner* — Nduka E Ojeh
(74) *Attorney, Agent, or Firm* — Venable LLP

(57) ABSTRACT

A light emitting thyristor includes a stack structure having first to fourth semiconductor layers, and the third semiconductor layer includes at least a fifth semiconductor layer in contact with the second semiconductor layer and a sixth semiconductor layer in this order from the semiconductor substrate side. The sixth semiconductor layer is a layer having the smallest bandgap in all the layers forming the stack structure, and a difference ΔEg in bandgap between the fifth semiconductor layer and the sixth semiconductor layer is greater than or equal to 0.05 eV and less than or equal to 0.15 eV.

20 Claims, 20 Drawing Sheets

(56) References Cited

U.S. PATENT DOCUMENTS

| | | |
|---|---|---|
| 8,265,114 B2 | 9/2012 | Nagatomo et al. |
| 8,416,826 B2 | 4/2013 | Nagatomo et al. |
| 2012/0327422 A1 | 12/2012 | Inao et al. |
| 2019/0052061 A1* | 2/2019 | Kondo ................... H01L 33/08 |
| 2019/0089859 A1* | 3/2019 | Kondo ............... H04N 1/02409 |
| 2019/0140137 A1* | 5/2019 | Kim ....................... H01L 33/04 |

* cited by examiner

LIGHT FLUX

LIGHT EMITTING THYRISTOR HAVING A PLURALITY OF SEMICONDUCTOR LAYERS WITH A SPECIFIC LAYER HAVING THE SMALLEST BANDGAP, LIGHT EMITTING THYRISTOR ARRAY, EXPOSURE HEAD, AND IMAGE FORMING DEVICE

BACKGROUND OF THE INVENTION

Field of the Invention

The present invention relates to a light emitting thyristor, a light emitting thyristor array, an exposure head, and an image forming device.

Description of the Related Art

One of electrographic printers is a printer employing a scheme of using an exposure head when exposing a photosensitive drum to form a latent image. An exposure head is formed of a light emitting element array in which a semiconductor light emitting elements such as light emitting diodes (LED) are aligned in the longitudinal direction of a photosensitive drum and a rod lens array that captures a light emitted from the light emitting element array on the photosensitive drum. Printers employing a scheme of using an exposure head have an advantage that reduction of size is easier than printers employing a laser scanning scheme in which deflection scanning of a laser beam is performed with a polygon mirror and thus are paid attention to.

One of the light emitting element arrays is a self-scanning light emitting thyristor array. A self-scanning light emitting thyristor array is structured such that shift thyristors having one-dimensionally aligned thyristors as switch elements and light emitting thyristors having one-dimensionally aligned thyristors as light emitting elements are integrated on the same substrate.

Japanese Patent Application Laid-Open No. 2013-65591 discloses that the quantum well structure is introduced inside a thyristor structure in a light emitting thyristor to improve a light emitting efficiency.

As disclosed in Japanese Patent Application Laid-Open No. 2013-65591, also in a light emitting thyristor, likewise the case of a light emitting element such as an LED, the luminance efficiency can be improved by introducing a layer having a smaller bandgap than peripheral layers (hereafter, referred to as "small Eg layer") as seen in the quantum well structure.

However, intensive study by the inventors has found that introducing a small Eg layer in a light emitting thyristor affects the on-characteristics and off-characteristics that are characteristics specific to a thyristor. These characteristics are not required to be taken into consideration for a two-terminal light emitting element such as an LED. Further, it has been found that, depending on the structure of a small Eg layer or the position of a small Eg layer in the thyristor structure, the small Eg layer may adversely affect the on-characteristics and the off-characteristics (hereafter, collectively referred to as "thyristor characteristics").

SUMMARY OF THE INVENTION

Accordingly, in view of the problem described above, the present invention intends to provide a light emitting thyristor that improves light emitting efficiency while maintaining thyristor characteristics.

A light emitting thyristor as one aspect of the present invention has a stack structure including, on a semiconductor substrate of a first conductivity type, a first semiconductor layer of the first conductivity type, a second semiconductor layer of a second conductivity type that is different from the first conductivity type, a third semiconductor layer at least a part of which is the first conductivity type, and a fourth semiconductor layer of the second conductivity type in this order. The third semiconductor layer includes a plurality of semiconductor layers and includes at least a fifth semiconductor layer of the first conductivity type in contact with the second semiconductor layer and a sixth semiconductor layer including the first conductivity type or i-type in this order from the semiconductor substrate side. The sixth semiconductor layer is a layer having the smallest bandgap in all the layers forming the stack structure, and a difference ΔEg between a bandgap of the fifth semiconductor layer and a bandgap of the sixth semiconductor layer is greater than or equal to 0.05 eV and less than or equal to 0.15 eV.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings. Note that the present invention is not limited to the embodiment described below, and the scope of the present invention includes a properly modified version, an enhanced version, or the like of the embodiment described below made based on ordinary knowledge of those skilled in the art without departing from the spirit of the present invention.

Configuration of Light Emitting Thyristor

Figure 1:
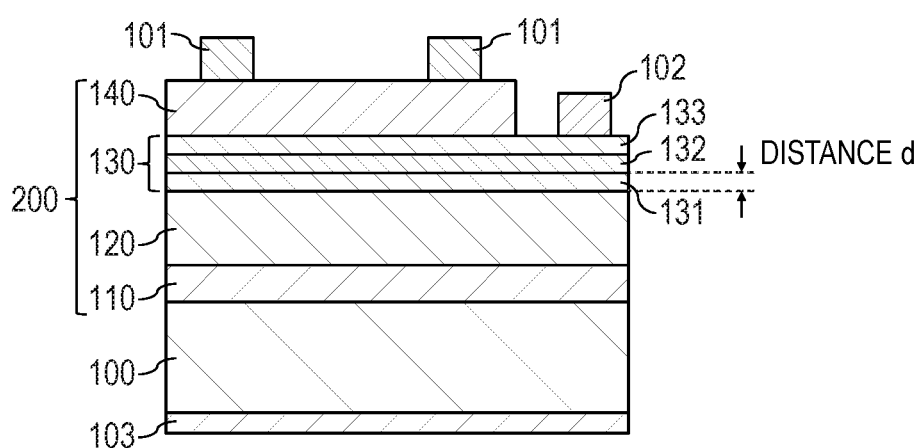
FIG. 1 is a diagram schematically illustrating the structure of a light emitting thyristor according to an embodiment.

As illustrated in FIG. 1, a light emitting thyristor L according to the present embodiment has a stack structure 200 in which a plurality of semiconductor layers are stacked on a substrate 100 (semiconductor substrate).

The substrate 100 is a semiconductor substrate of a first conductivity type. As a substrate 100, GaAs, InP, GaP, or the like can be used.

The stack structure 200 is a thyristor in which a plurality of semiconductor layers of different conductivity types are arranged in an alternating manner. In the stack structure 200, a first semiconductor layer 110, a second semiconductor layer 120, a third semiconductor layer 130, and a fourth semiconductor layer 140 are stacked in this order from the semiconductor substrate side (the substrate 100 side). The first semiconductor layer 110 is a semiconductor layer of the first conductivity type, and the second semiconductor layer 120 and the fourth semiconductor layer 140 have a second conductivity type that is different from the first conductivity type. Further, the third semiconductor layer 130 is a semiconductor layer of a conductivity type different from the second conductivity type. That is, the third semiconductor layer 130 has at least a semiconductor layer of the first conductivity type. Alternatively, the third semiconductor layer 130 has at least a semiconductor layer of the first conductivity type and a semiconductor layer of a third conductivity type that is different from the first and second conductivity types.

It is preferable that each semiconductor layer forming the stack structure 200 be formed of a group III-V compound semiconductor. It is preferable to use a GaAs based material, an AlGaAs based material, a GaP based material, a GaAsP based material, an InP based material, an AlAs based material, or an AlGaInP based material as the group III-V compound semiconductor. It is preferable that each semiconductor layer forming the stack structure 200 contain the GaAs based material or the AlGaAs based material among the above materials in terms of emission wavelength.

The stack structure 200 according to the present embodiment has thyristor structure of the structure in which four semiconductor layers (p-n-p-n structure or n-p-n-p structure) are stacked as described above. When the first conductivity type is the n-type, the second conductivity type is the p-type, and the stack structure 200 is such a thyristor that has an n-type semiconductor layer, a p-type semiconductor layer, an n-type semiconductor layer, and a p-type semiconductor layer in this order from the semiconductor substrate side (the substrate 100 side). When the first conductivity type is the p-type, the second conductivity type is the n-type, and the stack structure 200 is such a thyristor that has a p-type semiconductor layer, an n-type semiconductor layer, a p-type semiconductor layer, and an n-type semiconductor layer in this order from the semiconductor substrate side (the substrate 100 side). The first semiconductor layer 110 is the anode or the cathode of a thyristor, the second semiconductor layer 120 is the gate (or the base) of the thyristor. Further, the third semiconductor layer 130 is the gate (or the base) of the thyristor, and the fourth semiconductor layer 140 is the cathode or the anode of the thyristor.

Further, the light emitting thyristor L has a drive electrode 101 arranged on the fourth semiconductor layer 140, a gate electrode 102 arranged on the third semiconductor layer 130, and backside electrode 103 arranged opposed to the drive electrode 101 and the gate electrode 102 via the substrate 100. In the present embodiment, the drive electrode 101 is a ring-shaped or frame-shaped electrode. Another layer such as a current diffusion layer may be interposed between the drive electrode 101 and the fourth semiconductor layer 140.

The third semiconductor layer 130 is formed of a plurality of semiconductor layers and has at least a fifth semiconductor layer 131 in contact with the second semiconductor layer 120 and a sixth semiconductor layer 132 in this order from the semiconductor substrate side (the substrate 100 side). The fifth semiconductor layer 131 is a semiconductor layer of the first conductivity type. The sixth semiconductor layer 132 is a semiconductor layer of the first conductivity type. Alternatively, the sixth semiconductor layer 132 is a semiconductor layer of the third conductivity type different from the first conductivity type and the second conductivity type. Here, the first conductivity type and the second conductivity type are any one of the n-type and the p-type, the third conductivity type is the i-type. Further, the anode layer 140 is formed of p-type $Al_{0.4}GaAs$.

Note that an i-type semiconductor layer in the present specification refers to a non-doped (undoped) semiconductor layer. The term non-doped (undoped) refers to no dopant for controlling the conductivity type being intentionally doped during growth of a semiconductor layer. It is preferable that the dopant concentration in the i-type semiconductor layer be less than or equal to $1 \times 10^{16}$ cm$^{-3}$. Further, as a specific dopant element in each semiconductor layer, when each semiconductor layer is formed of an AlGaAs based material that is a group III-V semiconductor, Zn or Mg that is a group II element, C or Si that is a group IV element, or Se that is a group VI element is used.

The sixth semiconductor layer 132 is a layer having the smallest bandgap in the layers forming the stack structure 200 and is a layer having a smaller bandgap than the peripheral (above and under) layers (small Eg layer). By introducing the sixth semiconductor layer 132 that is a small Eg layer inside the third semiconductor layer 130, it is possible to concentrate carriers in the sixth semiconductor layer 132 and, as a result, improve the luminous efficiency of the light emitting thyristor L.

The fifth semiconductor layer 131 is a layer neighboring the second semiconductor layer 120. That is, the fifth semiconductor layer 131 forms the middle p-n junction of three p-n junctions included in the light emitting thyristor L between the fifth semiconductor layer 131 and the second semiconductor layer 120. A difference between the bandgap of the third semiconductor layer 130 and the bandgap of the sixth semiconductor layer 132 (bandgap difference ΔEg) is greater than or equal to 0.05 eV and less than 0.15 eV.

Further, it is preferable that the bandgap difference ΔEg be greater than or equal to 0.05 eV and less than or equal to 0.1 eV. The reason for this will be described later. Note that, in the present embodiment, the bandgap difference ΔEg is a difference between the bandgap of the fifth semiconductor layer 131 and the bandgap of the sixth semiconductor layer 132.

Once a drive voltage of the light emitting thyristor L is applied between the first semiconductor layer 110 and the fourth semiconductor layer 140 of the light emitting thyristor L in an off-state, a depletion layer occurs at the interface between the second semiconductor layer 120 and the third semiconductor layer 130. This depletion layer occurs extending over the interface. In the present embodiment, when the conductivity type of the sixth semiconductor layer 132 is the i-type, the distance d between the second semiconductor layer 120 and the sixth semiconductor layer 132 that is closest to the second semiconductor layer 120 is larger than the thickness of a portion of the depletion layer which occurs inside the third semiconductor layer 130. In other words, a depletion layer occurring at the interface between the semiconductor layer 130 having the sixth semiconductor layer 132 and the second semiconductor layer 120 that is another semiconductor layer neighboring the third semiconductor layer 130 is not in contact with the sixth semiconductor layer 132. The reason for this will be described later.

The light emitting thyristor L may further have a buffer layer (not illustrated) between the substrate 100 and the stack structure 200. Providing a buffer layer can improve crystal quality of the stack structure 200 formed on the substrate 100. The buffer layer is a semiconductor layer of the first conductive type that is the same as the conductive type of the substrate 100. As a buffer layer, it is preferable to use a semiconductor based on the same material as the substrate 100, and when the substrate 100 is a GaAs substrate, for example, GaAs, AlGaAs, or the like can be used.

The light emitting thyristor L may have a current-confined-path structure that constricts a region where a current injected from the drive electrode 101 or the backside electrode 103 flows in the light emitting thyristor L. This can cause a current flowing in the light emitting thyristor L to concentrate in a desired region and improve the luminous efficiency. The position of the current-confined-path structure is not limited in particular as long as it is arranged between the drive electrode 101 and the backside electrode 103. For example, the current-confined-path structure may be arranged inside each semiconductor layer or between semiconductor layers forming the stack structure 200 or may be arranged between the stack structure 200 and the drive electrode 101 or between the backside electrode 103 and the stack structure 200. As the current-confined-path structure, a conventional known structure may be used, and for example, a current-confined-path layer having a low resistive region and a high resistive region having a higher resistance than the low resistive region in a planar view from the stack direction can be used. The high resistive region can be formed by ion implantation or oxidation process from a mesa-side surface, for example.

The light emitting thyristor L may further have a distributed Bragg reflection layer (not illustrated) between the substrate 100 and the stack structure 200. The distributed Bragg reflection layer is also referred to as a Distributed Bragg Reflection (DBR) layer. The DBR layer is a layer that reflects a light emitted from the light emitting thyristor L to the surface side (the drive electrode 101 side) of the substrate 100. Providing the DBR layer can improve the luminous efficiency as a light emitting element. It is preferable that the DBR layer have a high reflection ratio for a wavelength of a light emitted from the light emitting thyristor L.

It is preferable that the DBR layer be configured with two different types of semiconductor layers of the first conductivity type being stacked in an alternating manner. As the two different types of semiconductor layers forming the DBR layer, AlGaAs having a high concentration Al composition (for example, an Al composition of 0.8) and AlGaAs of a low concentration Al composition (for example, an Al composition of 0.1) or the like may be used, for example.

While the configuration of the third semiconductor layer 130 having a small Eg layer 132 has been described in the above embodiment, any configuration may be employed without being limited thereto as long as the small Eg layer is included in any of the two layers forming the middle p-n junction. That is, the second semiconductor layer 120 may have the small Eg layer. When the second semiconductor layer 120 has the small Eg layer therein, the second semiconductor layer 120 is formed of a plurality of semiconductor layers. Further, the second semiconductor layer 120 has at least the fifth semiconductor layer of the second conductive type in contact with the third semiconductor layer and the sixth semiconductor layer of the third conductivity type in this order from the opposite side of the substrate 100.

As described above, while the small Eg layer is introduced in any of the second semiconductor layer 120 and the third semiconductor layer 130, it is preferable that the small Eg layer be introduced in the n-type semiconductor layer. It is therefore preferable that the third semiconductor layer 130 have the small Eg layer when the conductivity type of the substrate 100 is the n-type and the second semiconductor layer 120 have the small Eg layer when the conductivity type of the substrate 100 is the p-type.

Structure and Position of Small Eg Layer

Intensive study by the inventors has found that, when the small Eg layer is the first conductive type, introduction of the small Eg layer to the light emitting thyristor is one of the factors that affect the thyristor characteristics of the light emitting thyristor, that is, the on-characteristics and the off-characteristics. Further, the inventors has found that, when the small Eg layer is the third conductivity type (i-type), there are roughly two factors, in addition to the above one, that affect the on-characteristics and the off-characteristics.

First factor is the magnitude of a difference between the bandgap of the small Eg layer and the bandgap of the semiconductor layer (the fifth semiconductor layer 131) forming the middle p-n junction of respective layers forming semiconductor layers in which the small Eg layer is introduced (hereafter, referred to as "bandgap difference ΔEg"). As illustrated below, the study by the inventors has found that, when the bandgap difference ΔEg is greater than or equal to 0.05 eV and less than 0.15 eV, it is possible to improve the luminous efficiency while maintaining the thyristor characteristics.

The second factor is the magnitude of the distance between the small Eg layer and the middle p-n junction (the second p-n junction from the substrate side) out of three p-n junctions forming a light emitting thyristor (hereafter, referred to as "distance d") when the conductivity type of the small Eg layer is the i-type. In other words, the second factor is the thickness of the layer located between the middle p-n junction and the small Eg layer. As illustrated below, the study by the inventors has found that, when the distance d is larger than the thickness of a depletion layer formed inside a layer located between the middle p-n junction and the small Eg layer with a drive voltage being applied, it is possible to improve the luminous efficiency while maintaining the thyristor characteristics. Note that a light emitting thyristor has three p-n junctions, and the p-n junctions as used herein includes a pin junction.

Simulation for Structure and Position of Small Eg Layer

In the following, influence on thyristor characteristics caused by the two parameters described above (the bandgap difference ΔEg and the distance d) and a preferable range for improving the luminous efficiency while maintaining the thyristor characteristics will be described with reference to simulation results.

First, a layer structure and a calculation scheme of a simulation model of a light emitting thyristor used in this simulation will be described.

Simulation Model

Figure 2:
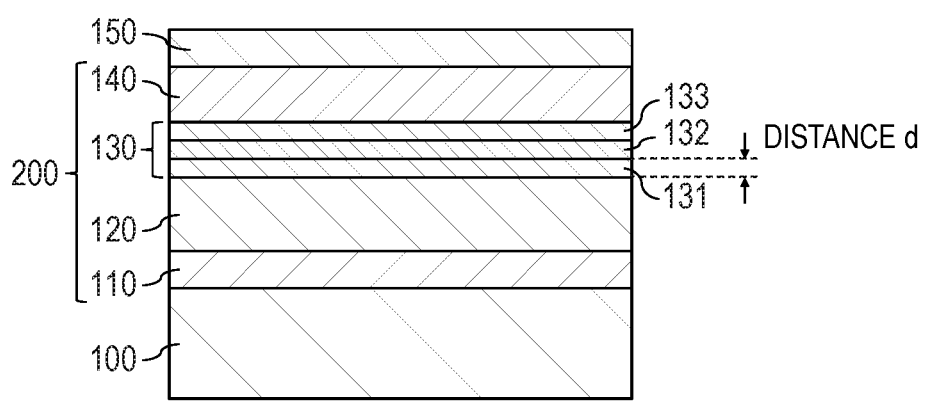
FIG. 2 is a diagram schematically illustrating the structure of a simulation model of a light emitting thyristor having a small Eg layer.

FIG. 2 is a diagram schematically illustrating the layer structure of the simulation model of a light emitting thyristor having a small Eg layer used in the simulation. As illustrated FIG. 2, the light emitting thyristor used in the simulation is structured such that a cathode layer 110, a p-base layer 120, an n-gate layer 130, an anode layer 140, and an overflow suppression layer 150 are stacked in this order on the GaAs substrate 100. In this simulation, it was assumed that each layer of the cathode layer 110, the p-base layer 120, the n-gate layer 130, the anode layer 140, and the overflow suppression layer 150 are formed of an AlGaAs based material.

It was assumed that the n-gate layer 130 has a three-layer configuration. The middle layer is a layer having a smaller Al composition than the above layer and the under layer (other two layers forming the n-gate layer), which is a layer having a small bandgap, namely, the small Eg layer 132. The n-gate layer 130 has a spacer layer 131 and a spacer layer 133 so as to interpose the small Eg layer 132 therebetween. The spacer layer 131 and the spacer layer 133 are formed of the same material and have the same bandgap.

Next, details of each layer of the light emitting thyristor used in the simulation will be described. It was assumed that the cathode layer 110 is made of AlGaAs and has a thickness of 600 nm. It was assumed that the p-base layer 120 is made of $Al_{0.22}GaAs$ and has a thickness of 720 nm and a doping concentration of $3\times10^{17}$ cm$^{-3}$. It was assumed that each of the spacer layer 131 and the spacer layer 133 is made of $Al_{0.22}GaAs$ and has a doping concentration of $2\times10^{17}$ cm$^{-3}$. It was assumed that the total thickness of the three layers forming the n-gate layer 130 (the small Eg layer 132, the spacer layer 131, and the spacer layer 133) is 350 nm. It was assumed that the anode layer 140 is made of AlGaAs. It was assumed that the overflow suppression layer 150 is made of $Al_{0.8}GaAs$ and has a thickness of 150 nm.

Calculation Method

In this simulation, the simulation model was divided into fine meshes in the stack direction, and numeric analysis was performed for respective meshes. Unlike an LED or a laser diode (LD), the light emitting thyristor takes two different states in accordance with the history of a current injected to the gate even when the same voltage is applied between the anode and the cathode. Accordingly, also in the simulation, these two states were represented for calculation.

Specifically, the simulation was performed on the following two states. In the first state, first, a drive voltage $V_{AK}$ that is a voltage for causing the light emitting thyristor to emit light is applied between the anode and the cathode while a gate current Ig of 1 mA is applied in the gate. Then, the gate current Ig is changed to 0 mA and held until a stable state is reached while the drive voltage $V_{AK}$ is applied between the anode and the cathode. The first state is a state that represents "on-condition" in a general light emitting thyristor. The second state is a state where the gate current Ig injected to the light emission gate is set to 0 mA without the drive voltage $V_{AK}$ being applied between the anode and the cathode and the drive voltage $V_{AK}$ is applied between the anode and the cathode with the gate current Ig being maintained at 0 mA. The second state is a state that represents "off-condition" in a general light emitting thyristor.

Simulation Result

Figure 3:
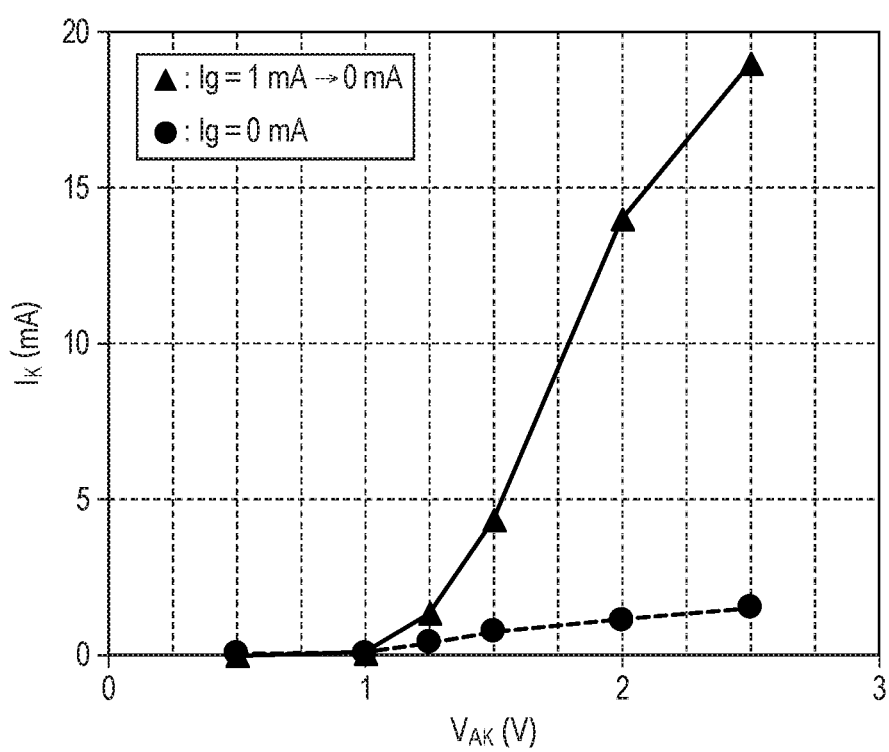
FIG. 3 is a diagram illustrating a result of a simulation for a light emitting thyristor with general structure having no small Eg layer.

Before describing a simulation result for the light emitting thyristor in which a small Eg layer is introduced, a simulation result for a light emitting thyristor having the general structure will be described. FIG. 3 is a diagram illustrating the simulation result for the light emitting thyristor having the general structure without the small Eg layer. A simulation is performed here on a light emitting thyristor of a single-layer configuration in which the n-gate layer 130 does not have the small Eg layer 132 of the light emitting thyristor illustrated in FIG. 2 as a light emitting thyristor having the general structure. FIG. 3 illustrates the cathode currents $I_K$ when the simulation is performed with different drive voltages $V_{AK}$ applied between the anode and the cathode, respectively, in this light emitting thyristor configuration. Note that, in this simulation, it was assumed that the sectional area of a portion where the cathode current $I_K$ flows (the area of a cross section perpendicular to the stack direction) is 10 μm×10 μm.

As illustrated in FIG. 3, in the light emitting thyristor having the general structure, in the first state (state representing "on-condition"), when the drive voltage $V_{AK}$ between the anode and the cathode is 1.25 V or higher, the cathode current $I_K$ continued to flow after the gate current Ig was set to 0 mA. That is, $V_{AK}$–$I_K$ characteristics for the typical on-state was confirmed. On the other hand, in the second state (state representing "off-condition"), a rise in the gate current Ig near the drive voltage $V_{AK}$ of 1.25 V between the anode and the cathode, which was observed in the first state, was not observed, and $V_{AK}$–$I_K$ characteristics for the typical off-state was confirmed. As discussed above, it was confirmed that the case of a constant current flowing in the gate and the case of no current flowing in the gate (held at 0 from the start) reached different results even when the drive voltage $V_{AK}$ between the anode and the cathode was the same.

In general, a thyristor is a semiconductor element capable of switching itself between an on-state and an off-state in accordance with whether or not a gate current is injected to the gate. Furthermore, a thyristor has characteristics in which, once a current flows from the anode to the cathode in an on-state, the on-state is held even after injection of the gate current is stopped, as observed in the simulation described above. In the present specification, such characteristics may be referred to as "on-characteristics". Further, a thyristor once turned on can be turned off by applying a reverse voltage between the anode and the cathode for a certain time period or holding a state where the current flowing from the anode to the cathode is below a predetermined value (holding current) for a certain time period. The thyristor that has been turned off by such a way has characteristics in which the off-state is held when a voltage applied between the anode and the cathode is below a predetermined voltage (brake over voltage) unless a gate current is injected into the gate. In the present specification, such characteristics may be referred to as "off-characteristics". Further, in the present specification, "on-characteristics" and "off-characteristics" are collectively referred to as "thyristor characteristics".

Next, a simulation result for the light emitting thyristor in which the small Eg layer 132 is introduced as illustrated in FIG. 2 will be described.

Influence of Bandgap Difference ΔEg

First, how the bandgap difference ΔEg affects the thyristor characteristics will be described by using a simulation result.

Table 1 indicates the cathode current $I_K$ when the simulation is performed for each of different bandgap differences ΔEg. In Table 1, a circle is filled when the cathode current $I_K$ did not decrease before and after a change of the gate current Ig in a first state (a state where the gate current Ig is changed from 1 mA to 0 mA and held to a stable state), and an x-mark is filled when the cathode current $I_K$ decreased. Note that, in this simulation, a configuration in which the center in the thickness direction of the small Eg layer 132 and the center in the thickness direction of the n-gate layer 130 are matched in in the simulation model of FIG. 2 was used as a simulation model. In other words, a configuration in which the spacer layer 131 and the spacer layer 133 arranged above and below the small Eg layer 132 have the same thickness was used as the simulation model. Further, the simulation is performed for cases of the drive voltage $V_{AK}$ between the anode and the cathode is 2.0V and 2.5 V, respectively.

TABLE 1

|  |  | $V_{AK}$ = 2.0 V | | $V_{AK}$ = 2.5 V | |
| --- | --- | --- | --- | --- | --- |
|  |  | On-state held | $I_K$/mA | On-state held | $I_K$/mA |
| ΔEg/ | 0 | ○ | 18.2 | ○ | 66.9 |
| eV | 0.05 | ○ | 13.6 | ○ | 48.1 |
|  | 0.105 | ○ | 10.2 | ○ | 28.1 |
|  | 0.15 | X | — | ○ | 6.4 |
|  | 0.21 | X | — | X | — |

Table 1 shows that, when $V_{AK}$=2.0 V, the on-state can be held for the bandgap difference ΔEg of 0.105 eV or less, and the on-state cannot be held for the bandgap difference ΔEg of 0.15 eV or greater. Further, Table 1 shows that, when $V_{AK}$=2.5 V, the on-state can be held for the bandgap difference ΔEg of 0.15 eV or less, and the on-state cannot be held for the bandgap difference ΔEg of 0.21 eV or greater. Note that, in all the cases indicated in Table 1, the off-state is held in the second state described above (state representing "off-state").

This shows that, when the small Eg layer is introduced in order to increase the luminous efficiency, the bandgap difference ΔEg is preferably less than 0.15 eV and more preferably less than 0.105 eV, in terms of the thyristor characteristics (in particular, the on-characteristics). It has been found that, with the bandgap difference ΔEg being less than 0.15 eV, the on-state can be held when the drive voltage $V_{AK}$ is 2.0 V or higher. Note that it has been found that, when the drive voltage $V_{AK}$ is 2.5 V or higher, the bandgap difference ΔEg is preferably less than 0.21 eV and more preferably less than or equal to 0.15 eV.

Note that, in LEDs, LDs, or the like, a quantum well structure having a small bandgap (corresponding to the small Eg layer in this specification) may be introduced in order to improve the luminous efficiency, and in this case, the bandgap difference ΔEg is often set to 0.2 eV or greater in terms of luminous efficiency. It is therefore appreciated that, if the quantum well structure often used in LEDs, LDs, or the like were directly applied to a light emitting thyristor, some drive voltage $V_{AK}$, material physical property (intraband transition probability of carriers or the like), or the like would be likely to adversely affect the on-characteristics. On the other hand, according to the present embodiment, when the bandgap difference ΔEg is less than 0.15 eV as described above, the on-state can be held even when the drive voltage $V_{AK}$ is reduced to 2.0 V.

The simulation result when the conductivity type of the small Eg layer is the i-type has been described above. A similar simulation has been performed on a case where the conductivity type of the small Eg layer 132 is the same conductivity type as the peripheral spacer layers 131 and 133, and the same result as described above was obtained with respect to whether or not the on-state can be held. That is, it has been found that, when $V_{AK}$=2.0 V, the on-state can be held for the bandgap difference ΔEg of 0.105 eV or less, and the on-state cannot be held for the bandgap difference ΔEg of 0.15 eV or greater. Further, Table 1 shows that, when $V_{AK}$=2.5 V, the on-state can be held for the bandgap difference ΔEg of 0.15 eV or less, and the on-state cannot be held for the bandgap difference ΔEg of 0.21 eV or greater. As discussed above, the conductivity type of the small Eg layer 132 is not limited to the i-type but may be the p-type or the n-type.

The reason why such a phenomenon occurs in which the on-state cannot be held for a large bandgap difference ΔEg when the small Eg layer is introduced to a light emitting thyristor is considered qualitatively as below.

A thyristor such as a light emitting thyristor turns to an on-state when carriers are accumulated in the gate layer or the base layer causing a so-called conductivity modulation. Once a gate current flows, carriers are injected and accumulated in the gate layer or the base layer resulting in an on-state, and a current flows from the anode to the cathode. Then, while the current flows from the anode to the cathode, accumulation of carriers in the gate layer or the base layer is maintained, and thus the on-state is held even when the gate current is stopped.

That is, in order to turn on a thyristor, a certain number of carriers are required to be accumulated in the gate layer or the base layer. On the other hand, when the small Eg layer is introduced inside the gate layer or the base layer, the small bandgap of the small Eg layer causes carries to concentrate in the small Eg layer. It is known that, in the case of an LED or an LD, by introducing a well layer of a quantum well structure having a small bandgap (corresponding to the small Eg layer in the present specification), it is possible to cause carriers to concentrate in that portion and, as a result, improve the luminous efficiency. Also in the light emitting thyristor, it is possible to improve the luminous efficiency by introducing the small Eg layer in the gate layer or the base layer to cause carriers to concentrate thereto. However, excessive concentration of carriers in the small Eg layer reduces carriers in the peripheral gate layer or base layer, which will prevent accumulation of a sufficient number of carriers and occurrence of conductivity modulation. As a result, if the bandgap difference ΔEg is large when a small Eg layer is introduced in a light emitting thyristor, the light emitting thyristor will be unable to hold an on-state or will not turn on even when the gate current flows.

On the other hand, even when a small Eg layer is introduced in a light emitting thyristor, an on-state can be held as long as the bandgap difference ΔEg is small to some extent. The possible reason for this is that carriers have a distribution expressed by Fermi-Dirac distribution in the energy direction. More specifically, a carrier distribution in the energy direction is expressed by a product of a Fermi-Dirac distribution f (E) and a state density gc (E) and gv (E) of a conductive band and a valence electron band, respectively. Thus, when the bandgap difference ΔEg is small to some extent, a certain number of carriers are present also in an energy position at the lower end of the conductive band and the upper end of the valence electron band of the gate layer and the base layer in accordance with a Fermi-Dirac distribution. There is a negative correlation between the bandgap difference ΔEg and the number of carriers present in the energy positions below the lower end of the conductive band and above the upper end of the valence electron band of the gate layer and the base layer. Further, it is considered that, with a sufficiently large number of carriers which extend out of the quantum well structure of the small Eg layer in such a way, the necessary number of carriers can be accumulated in the base layer or the gate layer, which enables conductivity modulation to occur as a result.

In a case of a bulk semiconductor, the values gc (E) and gv (E) can be expressed by Equation (1) and Equation (2), where effective weights of an electron and a hole are denoted as "me" and "mh", respectively. When a quantum well structure having a different shape of a state density from a bulk semiconductor, a carrier distribution can be similarly calculated by expression in accordance with a rectangular state density.

$$gc(E) = \frac{1}{2\pi^2}\left(\frac{2me}{\hbar^2}\right)^{\frac{3}{2}}(E-Ec)^{\frac{1}{2}} \quad \text{Equation (1)}$$

$$gv(E) = \frac{1}{2\pi^2}\left(\frac{2mh}{\hbar^2}\right)^{\frac{3}{2}}(E-Ec)^{\frac{1}{2}} \quad \text{Equation (2)}$$

Further, the Fermi-Dirac distribution f (E) can be expressed by Equation (3), where a Fermi level is denoted as $E_F$, and a temperature is denoted as T. When not in a thermal equilibrium state, for example, a state where a bias is applied between the anode and the cathode or the like, the carrier distribution of a conductive band and a valence electron band can be expressed by defining the Fermi level $E_F$ in Equation (3) to respective quasi-Fermi levels of the conductive band and the valence electron band.

$$f(E) = \frac{1}{1+\exp\left(\frac{E-E_F}{kT}\right)} \quad \text{Equation (3)}$$

As discussed above, it is appreciated that there is a kind of tradeoff relationship between the luminous efficiency and the on-characteristics in introduction of a small Eg layer into a light emitting thyristor. Accordingly, when a small Eg layer is introduced in a light emitting thyristor, it is important to appropriately select the bandgap difference ΔEg.

It is preferable that the upper limit value of the bandgap difference ΔEg be the maximum value that enables accumulation of carriers enough to cause conductivity modulation when the drive voltage $V_{AK}$ is applied. More specifically, as described above, when the drive voltage $V_{AK}$ is 2.5 V or higher, ΔEg is preferably less than 0.21 eV and more preferably less than or equal to 0.15 eV. Further, when the drive voltage $V_{AK}$ is 2.0 V or higher, ΔEg is preferably less than 0.15 eV and more preferably less than or equal to 0.105 eV.

The lower limit value of the bandgap difference ΔEg may be any value greater than 0 eV in terms of only whether or not an on-state can be held. In terms of luminous efficiency, however, it is preferable to confine a certain number of carriers in the small Eg layer, and thus a value larger than 0 eV to some extent is preferable for the lower limit value.

Table 2 illustrates a relationship between the bandgap difference ΔEg and a ratio of the number of carriers present inside the small Eg layer 132 to the number of carriers present in the entirety of the p-base layer 120 and the n-gate layer 130. It can be seen from Table 2 that, as the bandgap difference ΔEg increases, carriers are likely to concentrate inside the small Eg layer 132. In particular, comparison between the case of the bandgap difference ΔEg being 0 eV and the case of the bandgap difference ΔEg being 0.05 eV indicates that, when the bandgap difference ΔEg is 0.05 eV, this allows twice or more carriers to concentrate inside the small Eg layer 132. Therefore, in terms of causing carriers to concentrate to increase the luminous efficiency, the bandgap difference ΔEg is preferably greater than or equal to 0.05 eV and more preferably greater than or equal to 0.1 eV. Further, for some value of the drive voltage $V_{AK}$, the bandgap difference ΔEg is preferably greater than or equal to 0.15 eV.

TABLE 2

| | | Ratio of carriers inside small Eg layer @$V_{AK}$ = 2.5 V |
|---|---|---|
| ΔEg/ eV | 0 | 0.19 |
| | 0.05 | 0.5 |
| | 0.105 | 0.74 |
| | 0.15 | 0.86 |

To summarize the above, when the drive voltage $V_{AK}$ is 2.5 V or higher, ΔEg is preferably greater than or equal to 0.05 eV and less than 0.21 eV, more preferably greater than or equal to 0.05 eV and less than or equal to 0.15 eV, and particularly preferably greater than or equal to 0.1 eV and less than or equal to 0.15 eV. Further, when the drive voltage $V_{AK}$ is 2.0 V or higher, ΔEg is preferably greater than or equal to 0.05 eV and less than 0.15 eV and more preferably greater than or equal to 0.05 eV and less than or equal to 0.1 eV.

Influence of Distance d

Next, when the conductivity type of the small Eg layer is the i-type, how the distance d influences the thyristor characteristics will be described by using a simulation result.

Table 3 illustrates the cathode current $I_K$ when the simulation is performed for each of different the distances d. In Table 3, a circle is filled when the off-state was held, and an x-mark is filled when the off-state was unable to be held, in the second state (a state representing "off-condition" described above). Further, Table 3 illustrates the value of the cathode current $I_K$ in the first state (a state where the gate current Ig is changed from 1 mA to 0 mA and held to a stable state). Note that, in this simulation, it was assumed that ΔEg is 0.105 eV and the thickness of the small Eg layer 132 is fixed to 150 nm in the simulation model of FIG. 1. Then, the simulation was performed by changing the distance d between the small Eg layer 132 and a p-n interface formed between the p-base layer 120 and the n-gate layer 130. Note that, in this simulation, the distance d corresponds to the thickness of the spacer layer 131.

TABLE 3

| Distanced/nm | | Off-condition | | On-condition | |
|---|---|---|---|---|---|
| | | Off-state held | $I_K$/mA | On-state held | $I_K$/mA |
| Distanced/nm | 0 | x | — | o | 12.7 |
| | 50 | x | — | o | 11.8 |
| | 70 | o | 0.72 | o | 11.2 |
| | 95 | o | 0.69 | o | 10.2 |
| | 200 | o | 0.54 | o | 7.74 |

The result of the simulation shows that, as indicated in Table 3, an excessively small distance d causes turning-on (unable to hold the off-state) even when no current flows in the gate. That is, from this simulation, the inventors have found that the distance between the small Eg layer and the middle p-n junction greatly influences the thyristor characteristics when the small Eg layer is introduced in the light emitting thyristor. Further, it has been found that, with the configuration of FIG. 2 used in this simulation, the off-state cannot be held when the distance d is less than or equal to 50 nm.

In a case where the conductivity type of the small Eg layer is the i-type, the reason why an excessively small distance d causes turning on (unable to hold the off-state) even when no current flows in the gate is considered as below.

First, when a positive voltage (a voltage such that the potential is higher on the anode side than the cathode side) is applied between the anode and the cathode of a light emitting thyristor, the middle p-n junction of the three p-n junctions forming the light emitting thyristor is in a reverse bias state. That is, when most part of the voltage is applied to the middle p-n junction, a depletion layer occurs near the middle p-n junction, which serves as a barrier layer, and thereby the off-state (a state of blocking a current) is held. Then, a reverse current starts flowing for some reason in the middle p-n junction, which is a trigger for the light emitting thyristor to transfer to an on-state.

When a small Eg layer is arranged near the middle p-n junction, the end of the small Eg layer and the depletion layer formed by application of a reverse bias to the p-n junction come close to each other, and in some cases, the end of the small Eg layer enters the depletion layer. When the end of the small Eg layer enters the depletion layer, the band of a layer having a large bandgap Eg in contact with the small Eg layer is bent, and the depletion layer no longer provides the effect as a barrier layer. This will be described in more detail by using FIG. 4A and FIG. 4B.

Figure 4A:
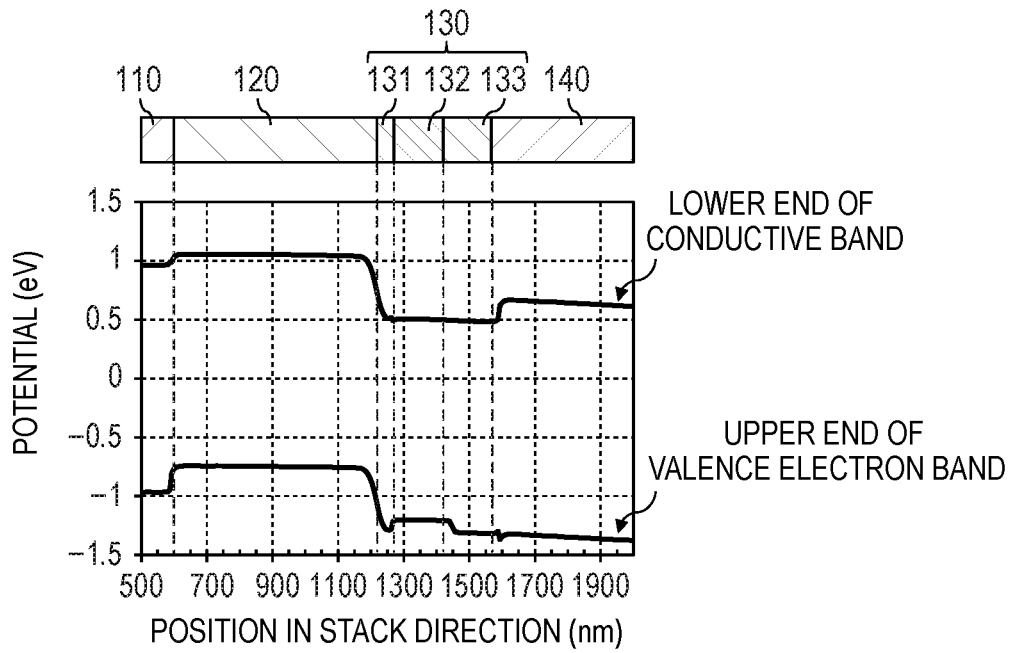
FIG. 4A and FIG. 4B are band diagrams when distance d is 50 nm and when distance d is 200 nm.
Figure 4B:
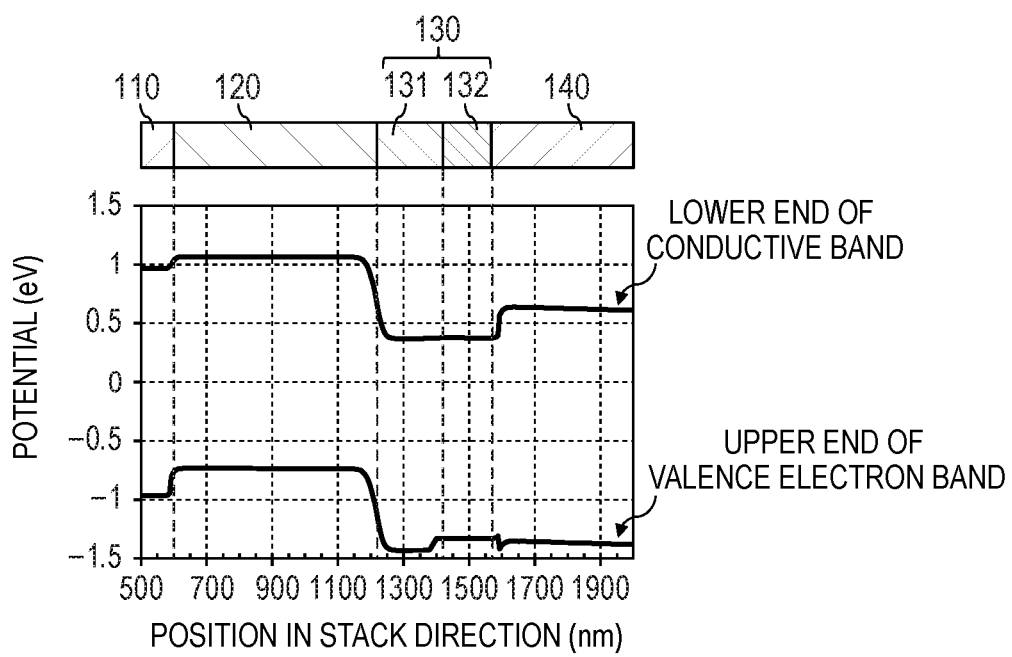

FIG. 4A and FIG. 4B illustrate calculation results of a band diagram near the p-base layer 120 and the n-gate layer 130 when the drive voltage $V_{AK}$ is 2.0 V in the second state described above (a state representing "off-condition"). FIG. 4A and FIG. 4B illustrate the upper end of the valence electron band and the lower end of the conductive band. FIG. 4A is the band diagram when the distance d is 50 nm, and FIG. 4B is a band diagram when the distance d is 200 nm. As indicated in Table 3, the off-state cannot be held when the distance d is 50 nm, and the off-state can be held when the distance d is 200 nm.

First, it can be seen from FIG. 4B that a voltage is applied between the p-base layer 120 and the n-gate layer 130 in the reverse direction. Further, when viewed from the interface between the p-base layer 120 and the n-gate layer 130, the small Eg layer 132 having a small bandgap is located at the end of the spacer layer 131 having a thickness of 200 nm. Note that the distance d is the same as the thickness of the spacer layer 131 illustrated in FIG. 4B. Further, when focusing on the valence electron band side, there is a level difference at the interface between the spacer layer 131 and the small Eg layer 132, and the valence electron band is flat in both sides of the level difference. Accordingly, it can be seen that the level difference described above functions as a barrier against holes and there is no acceleration by an electric field in both sides of the barrier.

On the other hand, it can be seen from FIG. 4A that the small Eg layer 132 is close to the depletion layer formed near the middle p-n junction, there is no flat part in the valence electron band of the spacer layer 131, and a downward convex shape occurs due to influence by both electric fields of the depletion layer and the small Eg layer 132. It is thus appreciated that this reduces the effect as a barrier against holes present inside the small Eg layer 132. While the distance d between the small Eg layer 132 and the p-n junction formed of the p-base layer 120 and the n-gate layer 130 is 50 nm in FIG. 4A, a smaller distance d will result in a lower height of the barrier due to the convex shape formed in the valence electron band described above. Thus, a current is more likely to flow in spite of application of the reverse bias to the middle p-n junction.

As considered above, it is appreciated that the distance d is required to be large for some extent in order to cause the level difference of the valence electron band formed between the small Eg layer 132 and the layer (the spacer layer 131) between the middle p-n junction and the small Eg layer 132 to function as a barrier. More specifically, it is appreciated that the distance d is required to be larger than the thickness of a part formed inside the spacer layer 131 out of the depletion layer formed in the middle p-n junction when the drive voltage $V_{AK}$ is applied in an off-state.

It can be seen from FIG. 4B that the thickness of a part formed inside the spacer layer 131 out of the depletion layer formed in the middle p-n junction corresponds to the thickness of a part where the valence electron band is in a slope and approximately 60 nm. Therefore, in the configuration of FIG. 2, the distance d is preferably greater than 60 nm and more preferably greater than or equal to 70 nm as indicated in Table 3.

Further, as indicated in Table 3, a larger distance d results in a smaller on-current (the cathode current $I_K$ in the first state). Thus, in terms of increasing the on-current, a smaller distance d is preferable. In the configuration of FIG. 2, it is preferable that the distance d be less than or equal to 200 nm. With the distance d being less than or equal to 200 nm, the reduction ratio of the cathode current $I_K$ from the cathode current $I_K$ at the distance d of 70 nm that is the minimum value that can hold an off-state in the configuration of FIG. 2 can be suppressed to be less than or equal to around 30%. Note that, when the distance d is 200 nm, since the thickness of the n-gate layer 130 is 350 nm and the thickness of the small Eg layer 132 is 150 nm in the configuration of FIG. 2, this results in two-layer structure of the spacer layer 131 and the small Eg layer 132 as illustrated also in FIG. 2.

Note that Table 3 indicates that, with an excessively small distance d, an off-state cannot be held. Thus, the case where the distance d is 50 nm, that is, the case where the spacer layer 131 is provided leads to a better off-condition compared to the case where the distance d is 0 nm, that is, the case where the spacer layer 131 is not provided. Therefore, in Table 3, it can be said that, when the distance d is 50 nm, while an x-mark is filled when the off-state was held, the case of the distance d of 50 nm is more effective than the case of the distance d of 0 nm.

Further, while an AlGaAs based material in which crystal is grown on an GaAs substrate is used as each semiconductor layer forming a light emitting thyristor in the simulation described above, the embodiment is not limited thereto. Each semiconductor layer forming a light emitting thyristor can be properly selected in accordance with a desired emission wavelength as described above. At this time, by designing the bandgap difference ΔEg or the distance d based on the design concept described above, it is possible to improve the luminous efficiency while maintaining the thyristor characteristics even with other base materials.

For example, when the $In_{0.47}GaAs$ is used for the small Eg layer 132, each of the electron effective weight "me" and the hole effective weight "mh" becomes around two-thirds to half compared to the case of $Al_{0.14}GaAs$ (ΔEg is 0.1 eV in the configuration of FIG. 1). Thus, according to Equation (1) and Equation (2), the carrier density at the energy positions at the lower end of the conductive band and the upper end of the valence electron band of the n-gate layer 130 becomes around half. In this case, according to Equation (3), by changing the bandgap difference ΔEg to around 0.08 eV, it is possible to realize the same level of carrier density as that in the case of ΔEg being 0.1 eV with $Al_{0.14}GaAs$ and realize the same level of thyristor characteristics. Further, when the base material of each semiconductor layer forming a light emitting thyristor is changed to another base material, or when an environmental temperature at which the light emitting thyristor operates changes, the bandgap difference ΔEg can be properly selected and designed in the same manner. Further, while the material with a single composition is used as the small Eg layer 132 in the above description, a plurality of layers made of different materials may be used.

As described above, according to the configuration of the present embodiment, a light emitting thyristor in which the luminous efficiency is improved while thyristor characteristics are maintained can be provided.

Width and Position of Small Eg Layer

When the small Eg layer is located closer to the anode side in a state where the conditions described above are satisfied, a further increase in light amount is realized. The reason for this will be described below.

Figure 17:
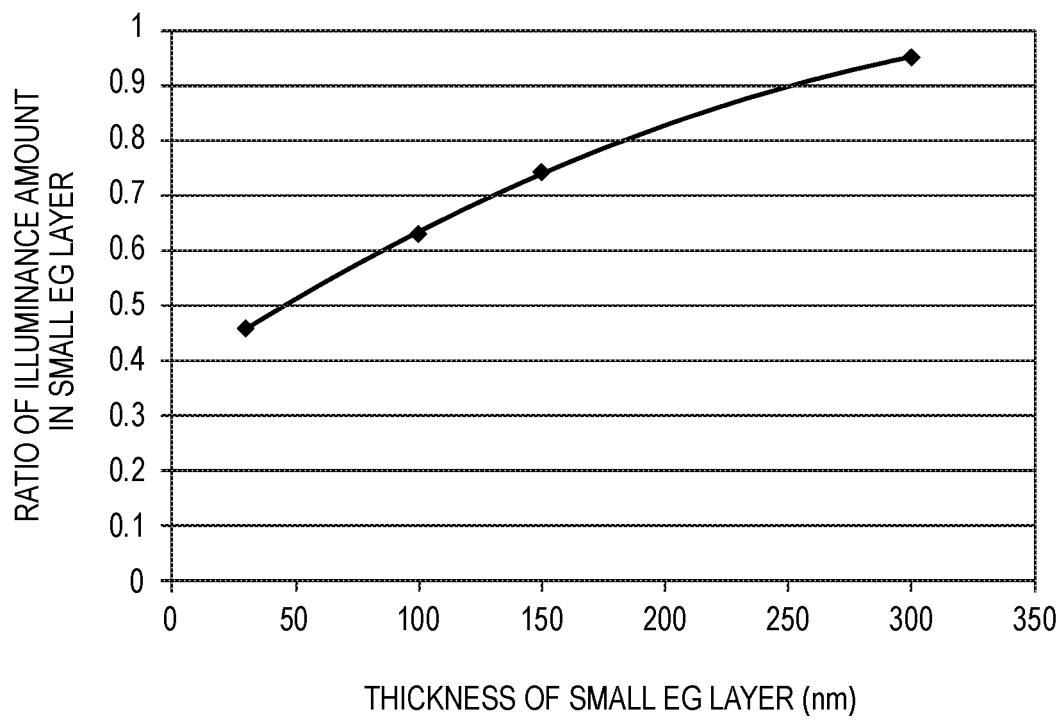
FIG. 17 is a graph illustrating a simulation result for a ratio of a light emission amount inside a small Eg layer to a light emission amount in a whole gate layer.

FIG. 17 is a graph illustrating a simulation result of a ratio of a light emission amount inside the small Eg layer to a light emission amount in the entire gate layer. It can be seen from FIG. 17 that, as the thickness of the small Eg layer increases, the ratio of the light emission amount inside the small Eg layer increases. In order to improve a light emission amount while maintaining the thyristor characteristics, it is preferable that the ratio of light emission amount be greater than or equal to 0.5 with the width of the small Eg layer being greater than or equal to 50 nm.

Figure 14:
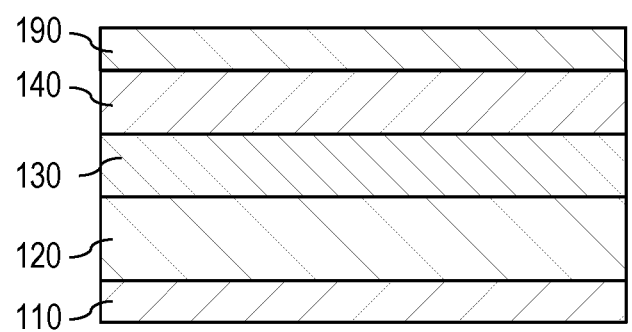
FIG. 14 is a diagram schematically illustrating the structure of a simulation model of a concentration distribution inside a light emitting thyristor.

FIG. 14 is a diagram illustrating the structure used in the simulation of a carrier concentration distribution inside the light emitting thyristor. As illustrated in FIG. 14, the light emitting thyristor used in the simulation is structured such that the cathode layer 110, the p-base layer 120, the n-gate layer 130, the anode layer 140, and oxidation confined-path layer 190 are stacked. Note that, in this simulation, the substrate is omitted.

Details of each layer of the light emitting thyristor used in this simulation will be described. It was assumed that the cathode layer 110 is made of $Al_{0.25}GaAs$ and has a thickness of 580 nm. It was assumed that the p-base layer 120 is made of $Al_{0.14}GaAs$ and has a thickness of 700 nm and a doping concentration of $2\times10^{17}$ $cm^{-3}$. It was assumed that the n-gate layer 130 is made of $Al_{0.14}GaAs$ and has a thickness of 340 nm and a doping concentration of $3\times10^{17}$ $cm^{-3}$. It was assumed that the anode layer 140 is made of $Al_{0.3}GaAs$ and has a thickness of 420 nm. It was assumed that the oxidation confined-path layer 190 is made of AlAs and has a thickness of 130 nm.

Figure 15:
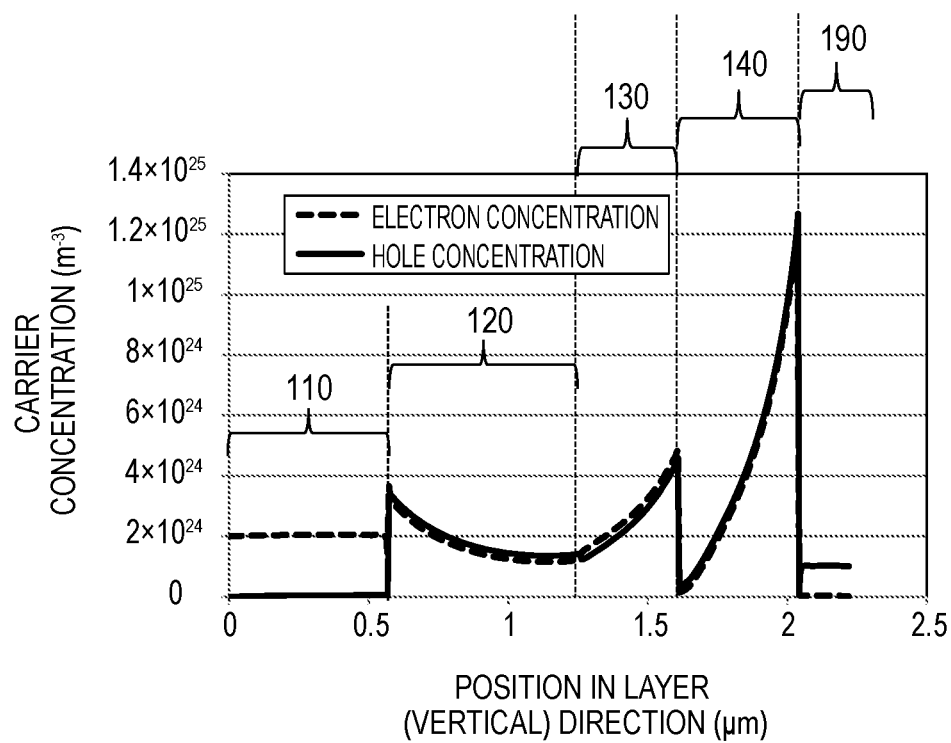
FIG. 15 is a graph illustrating a simulation result of a carrier concentration distribution.

FIG. 15 is a graph illustrating a simulation result of the carrier concentration distribution. It can be seen from FIG. 15 that the carrier concentration is higher for a part closer to the anode layer 140 inside the n-gate layer 130. Therefore, when the center position of the small Eg layer is located on the side closer to the anode layer 140 than the center position of the n-gate layer 130, the carrier concentration in the small Eg layer is increased, and thereby a further increase of light amount is realized.

As an example, when the thickness of the small Eg layer is 120 nm, the carrier concentration of holes when the center position of the small Eg layer is the same as the center position of the n-gate layer 130 is normalized to 1. In this case, the carrier concentration of holes when the small Eg layer is located in contact with the anode layer 140 (when the center position of the small Eg layer is shifted to the anode layer 140 side by 110 nm) is 1.56. On the other hand, the carrier concentration of holes when the small Eg layer is located in contact with the p-base layer 120 (when the center position of the small Eg layer is shifted to the p-base layer 120 side by 110 nm) is 0.64.

As described above, it is preferable that the small Eg layer provided inside the n-type semiconductor layer be arranged closer to the anode layer 140 in terms of carrier concentration distribution. Further, it is preferable that the small Eg layer be arranged at a position where the end of the small Eg layer is in contact with the anode layer 140.

Since the type of conductivity is different between the anode layer 140 and the small Eg layer, a problem of diffusion of dopants may be caused depending on a doping type, a concentration, a temperature history during a process, or the like. In such a case, it is preferable that a spacing enough to prevent influence of diffusion of dopants be provided between the small Eg layer and the anode layer 140. For example, it is preferable that the small Eg layer and the anode layer 140 be spaced apart from each other by 5 nm or more.

Examples of the present invention will be described below in more detail with reference to specific layer configurations or the like of a light emitting element.

Example 1

Figure 5:
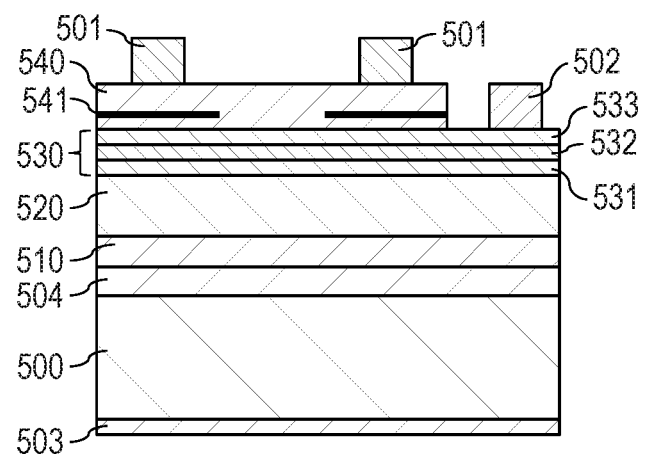
FIG. 5 is a diagram schematically illustrating the structure of a light emitting thyristor of Example 1.

FIG. 5 is an element sectional view of a light emitting thyristor of Example 1. In the light emitting thyristor of the present example, a GaAs buffer layer 504, a cathode layer 510, a p-base layer 520, an n-gate layer 530, and an anode layer 540 are stacked in this order on an n-type GaAs substrate 500. Further, an anode electrode 501 is formed on the anode layer 540. The anode electrode 501 is a ring electrode (frame-shaped electrode) and is structured to extract a light emitted at the n-gate layer 530 and the p-base layer 520 out of the opening. Further, a gate electrode 502 is arranged on the n-gate layer 530. Further, a cathode electrode 503 is arranged on the backside of the n-type GaAs substrate 500.

The cathode layer 510 is made of the n-type $Al_{0.6}GaAs$. The p-base layer 520 is made of the p-type $Al_{0.23}GaAs$ and has a thickness of 700 nm and a carrier concentration of $2\times10^{17}$ $cm^{-3}$. The n-gate layer 530 is formed of three layers of a spacer layer 531, a small Eg layer 532, and a spacer layer 533. The space layer 531 is made of the n-type $Al_{0.23}GaAs$ and has a thickness of 100 nm and a carrier concentration of $2\times10^{17}$ $cm^{-3}$. The small Eg layer 532 is made of $Al_{0.14}GaAs$, has a thickness of 150 nm, and is non-doped (undoped). The spacer layer 533 is made of the n-type $Al_{0.23}GaAs$ and has a thickness of 100 nm and a carrier concentration of $2\times10^{17}$ cm$^{-3}$. Further, the anode layer 540 is made of p-type $Al_{0.4}GaAs$.

In the present example, as described above, the small Eg layer is introduced inside the third semiconductor layer, the spacer layer 531 corresponds to the fifth semiconductor layer, and the small Eg layer 532 corresponds to the sixth semiconductor layer. Further, in the present example, the difference ΔEg between the bandgap of the spacer layer 531 and the bandgap of the small Eg layer 532 is 0.1 eV. Therefore, as indicated in the simulation described above, the light emitting thyristor of the present example exhibits good on-characteristics even when the drive voltage $V_{AK}$ is reduced to 2.0 V. Further, since the small Eg layer is introduced in the present example, it is possible to cause carriers to concentrate in the small Eg layer and improve the luminous efficiency. That is, according to the present example, it is possible to improve the luminous efficiency while maintaining thyristor characteristics.

Further, in the present example, the oxidation confined-path layer 541 that functions as a current confined-path structure that confines carriers (current) injected from the anode electrode 501 is arranged inside the anode layer 540. The oxidation confined-path layer 541 is formed by a configuration and a fabrication method similar to an oxidation confined-path layer widely used in a surface light emitting laser. Specifically, the oxidation confined-path layer 541 is formed by oxidizing an $Al_{0.98}GaAs$ layer by using water vapor from the mesa side surface. The oxidization is limited to a predetermined distance from the sidewall and the center part thereof is not oxidized, and thereby a region through which a current can pass is left and the current confined-path structure is realized. Note that, while the oxidation confined-path structure in which an $Al_{0.98}GaAs$ layer is partially oxidized is used as the current confined-path structure in the present example, other configurations than the oxidation confined-path structure may be used as long as it is structured to enable current confinement. With the current confined-path structure being provided in such a way, the light extraction efficiency can be improved.

Example 2

Figure 6:
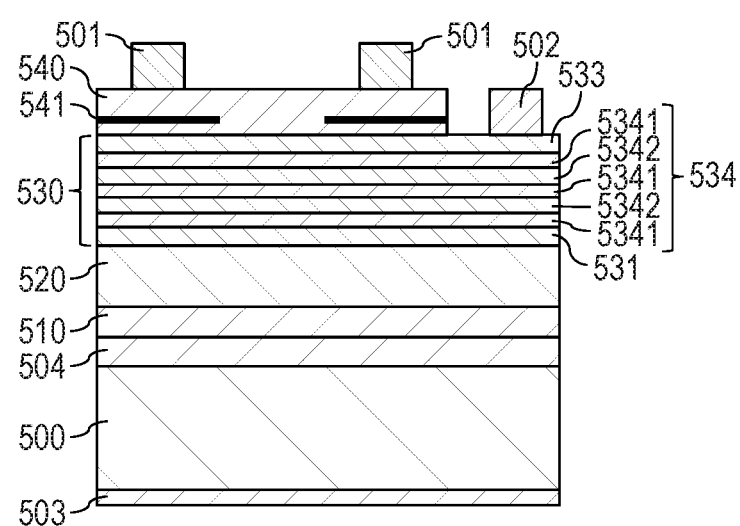
FIG. 6 is a diagram schematically illustrating the structure of a light emitting thyristor of Example 2.

FIG. 6 is an element sectional view of a light emitting thyristor of Example 2. In the light emitting thyristor of the present example, a multi-quantum well structure (MQW structure) 534 is provided instead of the small Eg layer 532 of the light emitting thyristor of Example 1. Since the structure of other parts is the same as that of Example 1, the description thereof will be omitted.

The MQW structure 534 is structured such that barrier layers 5341 and quantum well layers 5342 are stacked in an alternating manner. In the present example, the MQW structure 534 has 15 layers of the quantum well layers 5342 and 16 layers of the barrier layers 5341. Each barrier layer 5341 is made of $Al_{0.23}GaAs$, has a thickness of 6 nm, and is undoped. On the other hand, each quantum well layer 5342 is made of $Al_{0.06}GaAs$, has a thickness of 8 nm, and is undoped.

As discussed above, as the small Eg layer, the structure of a so-called quantum well whose thickness in the stack direction is around an electron wavelength or the structure of a so-called quantum dot whose thickness in the stack direction and size of the structure in the direction perpendicular to the stack direction are around an electron wavelength can be used. In such a case, one or a plurality of quantum levels occur in the valence electron band and the conductivity band due to quantization. Then, the energy difference between ground levels having the smallest energy difference out of the quantum levels occurring in the valence electron band and the conductivity band is different from the bandgap with a bulk of the same base material. In the present specification, when the quantum well structure or the quantum dot structure is used as a small Eg layer, the energy difference between ground levels having the smallest energy difference of the quantum levels is to be interpreted as "bandgap of a small Eg layer".

The reason for using the quantum well structure in the present example is to reduce the width of the light emission spectral. In the same manner as the case of an LED or an LD, by changing the structure of the light emitting layer from the bulk to the quantum well structure, it is possible to form the state density to be rectangular and, as a result, reduce the width of the light emission spectral. Further, in the present example, the number of quantum wells is not just one to four, which is often used in an LD, but 15. This is because the carrier density accumulated in each of the quantum wells can be reduced allowing a smaller absolute value of the width by which the quasi-Fermi level of carriers varies when the drive current changes. A smaller absolute value of the width by which the quasi-Fermi level of carriers varies leads to stabilized thyristor characteristics.

The emission wavelength of the ground level of the quantum well layer 5342 is 780 nm. Since the emission wavelength of the ground level is 780 nm, the energy difference (bandgap) between the ground levels of the conductive band and the valence electron band is 1.6 eV. Thus, the difference ΔEg in bandgap between the quantum well layer 5342 and the spacer layers 531 and 533 is 0.1 eV. Therefore, as indicated in the simulation described above, the light emitting thyristor of the present example exhibits good on-characteristics even when the drive voltage $V_{AK}$ is reduced to 2.0 V. Further, since the small Eg layer is introduced in the present example, it is possible to cause carriers to concentrate in the small Eg layer and improve the luminous efficiency. That is, according to the present example, it is possible to improve the luminous efficiency while maintaining thyristor characteristics.

Example 3

Figure 7A:
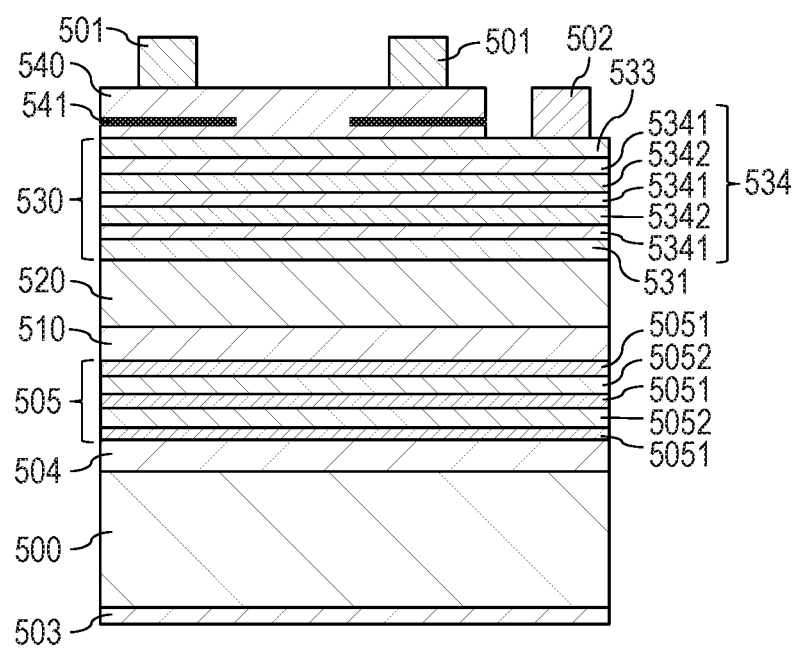
FIG. 7A and FIG. 7B are diagrams schematically illustrating the structure of a light emitting thyristor of Example 3.

FIG. 7A is an element sectional view of a light emitting thyristor of Example 3. In the light emitting thyristor of the present example, a DBR layer 505 is further arranged between the cathode layer 510 and the GaAs buffer layer 504 in the light emitting thyristor of Example 2. Since the structure of other parts is the same as that of Example 2, the description thereof will be omitted.

The DBR layer 505 has a stack structure in which lower refractive index layers 5051 made of $Al_{0.8}GaAs$ and higher refractive index layers 5052 made of $Al_{0.3}GaAs$ are stacked in an alternating manner. Each optical thickness of the lower refractive index layer 5051 and the high reflective index layer 5052 is one-fourth the emission wavelength of 780 nm of the light emitting thyristor. The optical thickness of a film as used herein is a product of a physical film thickness and a refractive index of the film. Since the low refractive index layer and the high refractive index layer both have an optical film thicknesses of one-fourth of 780 nm but have different refractive indexes, the actual film thicknesses thereof are different. The number of stacked layers is 21 for the low refractive index layers 5051 and 20 for the high refractive index layers 5052. The doping concentration of the DBR layer 505 is even and is $2\times10^{18}$ cm$^{-3}$.

Figure 7B:
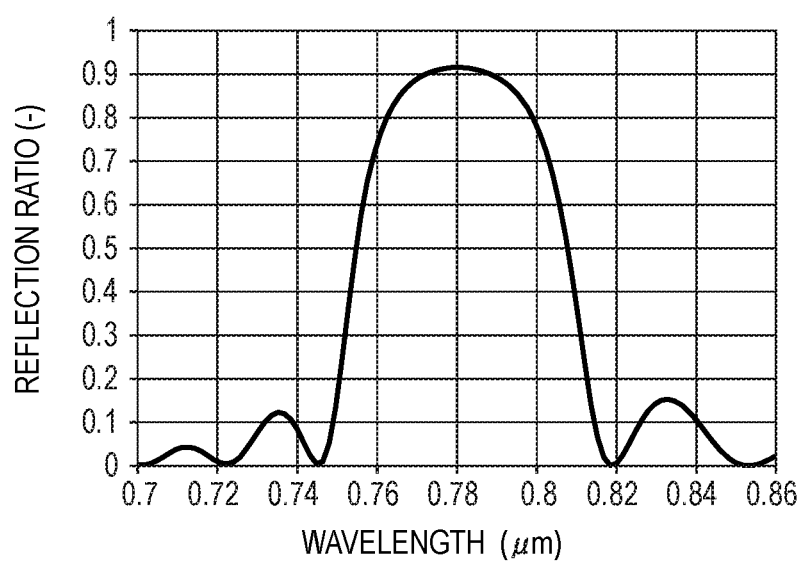

The reason for introducing the DBR layer 505 in the present example is to reflect, to the surface side, a light emitted to the GaAs substrate 500 side of the light emitted by the light emitting thyristor to increase a light amount emitted from the surface. FIG. 7B illustrates a reflection rate spectral of the DBR layer 505 used in the present example. In the DBR layer 505 of the present example, the maximum value of the reflection rate is around 91% near the wavelength of 780 nm that is a designed wavelength of the light emitting thyristor, and the light amount emitted out of the upper part of the light emitting thyristor is 1.5 times or more the light amount when the DBR layer 505 is not provided. Further, wavelengths at which the reflection rate is half the peak value are 754 nm on the shorter wavelength side and 809 nm on a longer wavelength side. When a band between wavelengths at which the reflection rate is half the peak value is defined as a high-reflection band of the DBR layer 505, the high-reflection bandwidth in the present example is 55 nm. In the present example, because the DBR layer 505 is provided for the purpose of reflecting a light emitted by the light emitting thyristor as described above, it is desirable that the peak value of the emission wavelength of the light emitting thyristor be within the high-reflection band of the DBR layer 505.

In the present example, carriers concentrate in the quantum well layers 5342, and light emission re-coupling causes light emission. Thus, the peak of the emission wavelength of the light emitting thyristor is the peak of the wavelength of a light emitted by light emission re-coupling in the quantum well layers 5342. In the quantum well layer, transition between the ground levels out of the quantum levels occurring inside the quantum well results in the emission wavelength described above, and in a bulk semiconductor, a wavelength near the wavelength corresponding to the bandgap of the semiconductor is the wavelength of the light emission peak.

According to the present example, it is possible to improve the luminous efficiency while maintaining thyristor characteristics in the same manner as Example 1 and Example 2. Further, since the DBR layer is further introduced in the present example, it is possible to further improve the luminous efficiency as a light emitting element. Note that, in the present example, a barrier layer 1201 and a quantum well layer 1202 forming the MQW structure 534 may be doped.

Figure 19A:
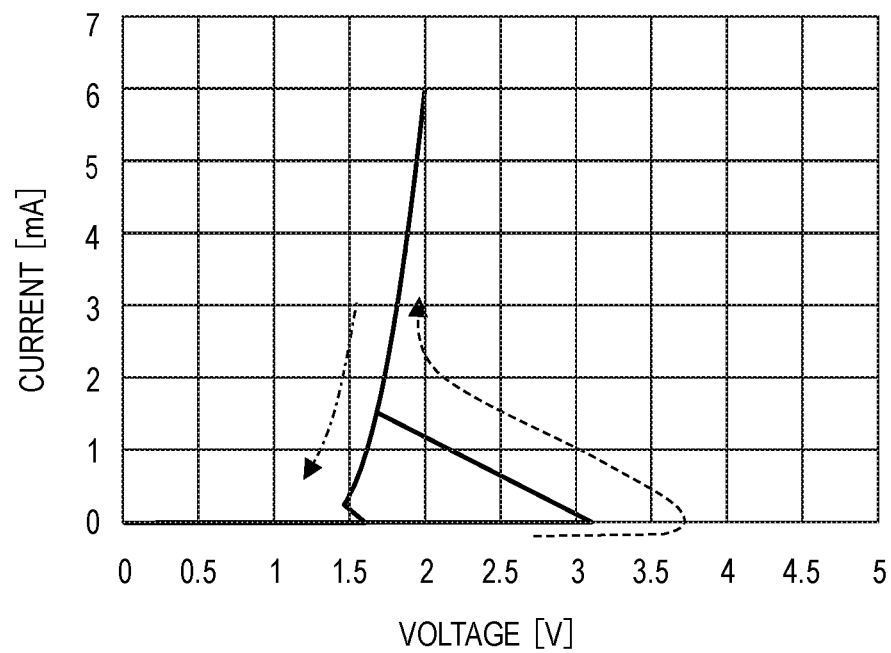
FIG. 19A and FIG. 19B are graphs illustrating I-V curves of light emitting thyristors of Example 3 and Comparative example 1.

A light emitting thyristor corresponding to Example 3 and a light emitting thyristor according to a comparative example were fabricated, and current-voltage characteristics (I-V curve) were measured. The I-V curve will be described. FIG. 19A is a graph illustrating an I-V curve of the light emitting thyristor corresponding to Example 3. Note that, while a light emitting thyristor by which measurement of FIG. 19A was performed has substantially the same configuration as that of Example 3, there are differences in the following points. The thickness of the n-gate layer 530 is 340 nm, and the barrier layer 5341 is made of $Al_{0.22}GaAs$. Further, the quantum well layer 5342 is made of $Al_{0.06}GaAs$, ΔEg is 0.105 eV, and the distance d is 65 nm.

First, a measurement condition of an I-V curve will be described. The graph of FIG. 19A illustrates a relationship between a voltage and a current obtained by applying a voltage between the anode and the cathode with the gate of the light emitting thyristor being opened (Open) and measuring a current flowing from the anode to the cathode. Since the I-V curve of the light emitting thyristor has a hysteresis, different characteristics are obtained depending on the sweep direction of the voltage. Thus, first, measurement of a forward path was performed by gradually increasing the application voltage between the anode and the cathode from 0 V (arrow in a dashed line), and after the light emitting thyristor transfers to "on-state", measurement of a return path was then performed by gradually decreasing the voltage (arrow in a dot-dash line).

As illustrated in FIG. 19A, "off-state" is continued from 0 V to around 3 V in the measurement of the forward path. Once the light emitting thyristor transfers to "on-state" near 3 V, the "on-state" is held in a rage of at least 2.0 V to 2.5 V. Further, a light amount output from the light emitting thyristor when a current of 5.0 mA flows was 300 μW at a room temperature.

Comparative Example 1, Difference in I-V Curve for ΔEg

Figure 19B:
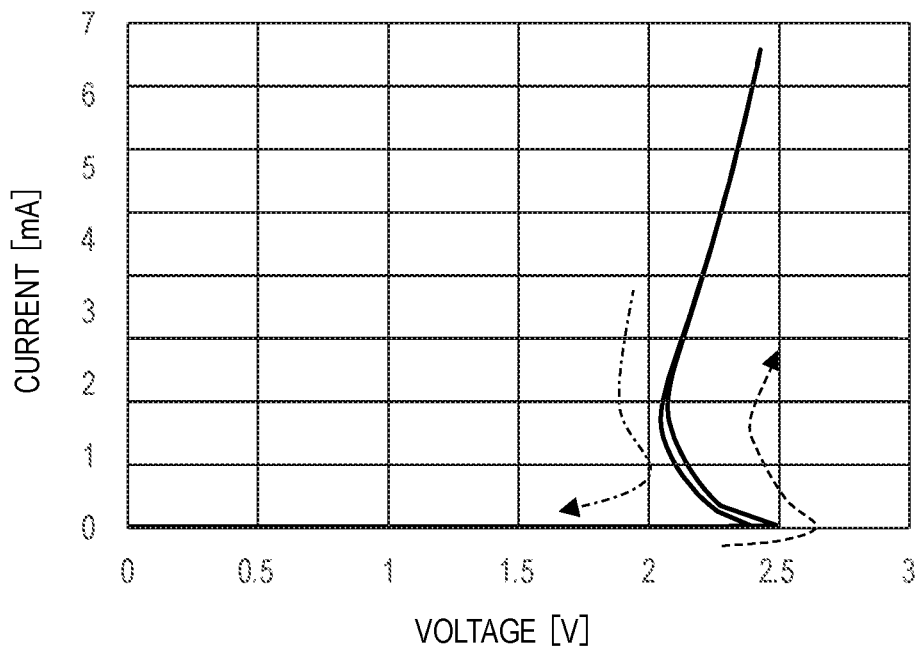

As Comparative example 1 for Example 3, FIG. 19B illustrates an I-V curve of a light emitting thyristor having a different ΔEg value from that in the configuration whose I-V curve is illustrated in FIG. 19A. Specifically, the barrier layer 5341 of the light emitting thyristor of FIG. 19B is made of $Al_{0.30}GaAs$, and ΔEg is 0.21 eV.

As illustrated in FIG. 19B, "off-state" is held from 0 V to around 2.5 V in the measurement of the forward path. Then, once a current flows out and the light emitting thyristor transfers to "on-state", the voltage gradually decreases and then turns to increase again. The rising rate of the voltage to the current after the voltage turns to increase is larger than that of FIG. 19A. Further, the forward path and the return path substantially overlap with each other in the I-V curve of Comparative example 1, and no hysteresis that is specific to a thyristor is found.

Comparative Example 2, Difference in I-V Curve for Distance d

Figure 20A:
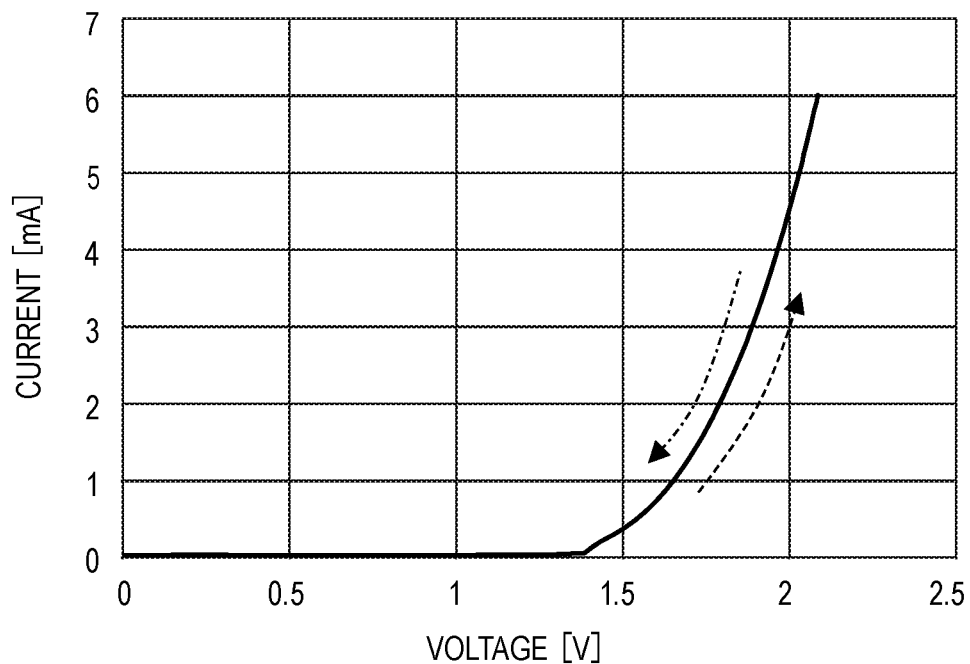
FIG. 20A and FIG. 20B are graphs illustrating an I-V curve of a light emitting thyristor of Comparative example 2.
Figure 20B:
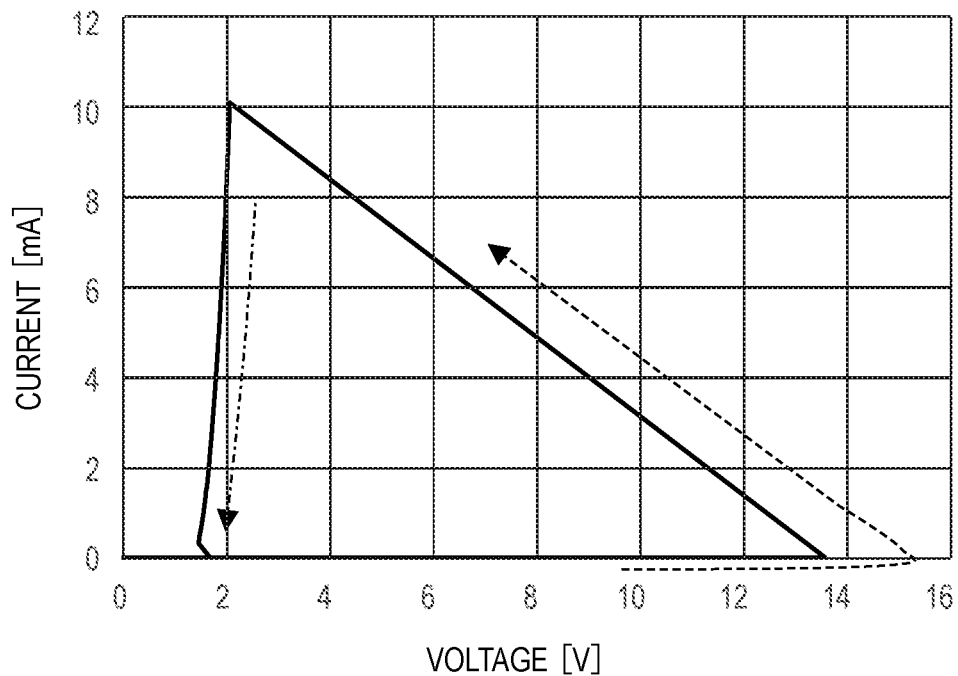

As Comparative example 2 for Example 3, FIG. 20A and FIG. 20B illustrate I-V curves of a light emitting thyristor having a different value d and the thickness of the n-gate layer 530 from that in the configuration whose I-V curve is illustrated in FIG. 19A. Specifically, in the present comparative example, FIG. 20A illustrates an I-V curve corresponding to one in which a thickness of the n-gate layer 530 is 0.8 times that of Example 3. In this case, the distance d is 31 nm. Further, FIG. 20B illustrates an I-V curve corresponding to one in which a thickness of the n-gate layer 530 is 1.2 times that of Example 3. In this case, the distance d is 99 nm.

In FIG. 20A, the forward path and the return path overlap with each other. Further, in FIG. 20A, there is no "off-state", a current starts flowing gradually from a low voltage, which does not exhibit thyristor characteristics. In this structure, the distance d is 31 nm that is smaller than 50 nm. This is a region where "off-state" cannot be held also in the simulation.

On the other hand, in FIG. 20B, the forward path and the return path are different from each other, and "off-state" is held from 0 V to above 13V. Further, once the light emitting thyristor transfers to "on-state", the "on-state" is held even with a low voltage of around 2.0 V. In this structure, the distance d is 99 nm that is greater than 50 nm. This is a region "off-state" can be held also in the simulation.

Example 4, P-Substrate Thyristor

Figure 8:
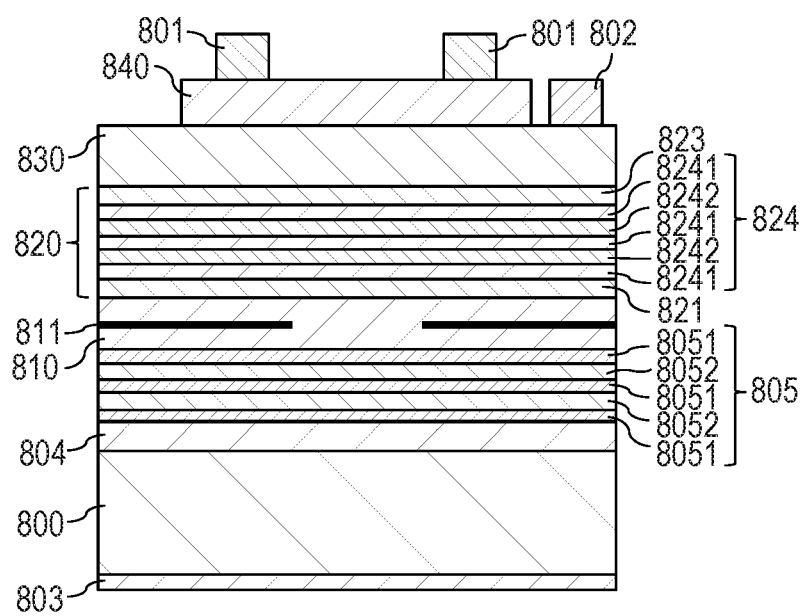
FIG. 8 is a diagram schematically illustrating the structure of a light emitting thyristor of Example 4.

FIG. 8 is an element sectional view of a light emitting thyristor of Example 4. The light emitting thyristor of the present example is different from Example 3 at least in that a p-type GaAs substrate is used as a semiconductor substrate and is different from Example 3 in stack order of respective layers, the type of conductivity of some of the layers, or the like.

In the light emitting thyristor of the present example, a p-type GaAs buffer layer 804, a DBR layer 805, an anode layer 810, an n-base layer 820, a p-gate layer 830, and a cathode layer 840 are stacked in this order on a p-type GaAs substrate 800. Further, a cathode electrode 801 is formed on the cathode layer 840. The cathode electrode 801 is a ring electrode (frame electrode) and is structured such that a light emitted by the p-gate layer 830 and the n-base layer 820 are extracted out of the opening. Further, a gate electrode 802 is arranged on the p-gate layer 830. Further, an anode electrode 803 is arranged on the backside of the p-type GaAs substrate 800.

The DBR layer 805 has a stack structure in which lower refractive index layers 8051 made of the p-type $Al_{0.8}GaAs$ and higher refractive index layers 8052 made of the p-type $Al_{0.3}GaAs$ are stacked in an alternating manner. Each optical thickness of the lower refractive index layer 8051 and the high reflective index layer 8052 is one-fourth the emission wavelength of 780 nm of the light emitting thyristor. Note that, since the low refractive index layer 8051 and the high refractive index layer 8052 have different refractive indexes, the actual film thicknesses thereof are different. The number of stacked layers is 16 for the low refractive index layers 8051 and 15 for the high refractive index layers 8052. The doping concentration of the DBR layer 805 is even and is $1 \times 10^{18}$ cm$^{-3}$.

Likewise the reason for introducing the DBR layer 505 in Example 3, the reason for introducing the DBR layer 805 in the present example is to reflect, to the surface side, a light emitted to the p-type GaAs substrate 800 side of the light emitted by the light emitting thyristor to increase a light amount emitted out of the surface.

The anode layer 810 is made of p-type $Al_{0.6}GaAs$. The n-base layer 820 has the same configuration as the n-gate layer 530 of Example 2 and is formed of the spacer layer 821, the multi-quantum well (MQW) structure 824, and the spacer layer 823. Each of the spacer layer 821 and the spacer layer 823 is made of n-type $Al_{0.23}GaAs$, has a thickness of 100 nm and a carrier concentration of $2 \times 10^{17}$ cm$^{-3}$. The MQW structure 824 has the same structure as the MQW structure 534 of Example 2. The p-gate layer 830 is made of p-type $Al_{0.23}GaAs$, has a thickness of 700 nm and a carrier concentration of $2 \times 10^{17}$ cm$^{-3}$.

The reason for using the p-type GaAs substrate 800 in the present example is to have an n-type semiconductor layer as the top layer (fourth semiconductor layer) of the semiconductor stack structure forming the light emitting thyristor. In the present example, this allows an n-type semiconductor layer to be located directly under an upper electrode (the cathode electrode 801) in the semiconductor layer configuration forming the light emitting thyristor. This enables a current injected from the upper electrode (the cathode electrode 801) to flow in the lateral direction (direction from a part directly under the electrode to the center of the element) in the n-type semiconductor layer (the cathode layer 840) of the top layer of the semiconductor layer structure. In general, since carrier mobility is greater in an n-type semiconductor than in a p-type semiconductor, the resistance when a current flows in the lateral direction can be reduced. Thereby, before a current reaches the second semiconductor layer and the third semiconductor layer forming the middle p-n junction, the current can be sufficiently diffused in the lateral direction in the fourth semiconductor layer. As a result, uniformity of light emission when viewed from the top of the light emitting thyristor can be improved.

While the n-type GaAs substrate 500 is used in Examples 1 to 3, modification to the configuration in which the fourth semiconductor layer is an n-type semiconductor layer can be made in the same manner as Example 4 by inverting the conductivity type of each semiconductor layer forming the light emitting thyristor described in each example. The expression "inverting the conductivity type" as used herein specifically means to replace the n-type GaAs substrate 500 with a p-type GaAs substrate, each n-type layer and each p-type layer above the substrate with a p-type layer and with an n-type layer, respectively. Thereby, the top layer of the semiconductor stack structure can be the n-type, and the same effect and advantage as in Example 4 can be obtained.

Note that, when an n-type substrate is used, since the thyristor has the p-n-p-n structure, the fourth semiconductor layer, that is, the top layer is the p-type. In this case, although the advantage when the n-type semiconductor layer described above is used as the top layer cannot be obtained, instead, there is an advantage of using an n-type substrate. Specifically, considering a whole semiconductor industry, since the share of n-type substrates is larger than that of p-type substrates, it is easier to reduce cost when the n-type substrate is used. Further, in terms of crystal quality such as defect density or the like, availability of good quality substrates of n-type substrates is better than that of p-type substrates. Thus, when these advantages are more important, it is preferable to use the n-type GaAs substrate. Note that, when the conductivity type of each semiconductor layer forming the light emitting thyristor is inverted in Example 4, Example 4 can be modified to the configuration using the n-type GaAs substrate.

In Examples 1 to 3, the small Eg layer is located in the gate layer in which a gate current flows. Thus, when only the gate current flows, light emission by the gate current occurs. On the other hand, in Example 4, no small Eg layer is located inside the gate layer. Thus, even when the gate current is applied, the gate current flows from the p-gate layer 830 to the cathode layer 840, and the gate current does not flow in the small Eg layer, and thus there is no light emission in the small Eg layer. Thus, when it is preferable to cause light emission by the gate current, it is desirable to provide the small Eg layer inside the gate layer as illustrated in Examples 1 to 3. On the other hand, when it is preferable to avoid light emission by only the gate current, it is disable to provide no small Eg layer inside the gate layer as illustrated in Example 4.

Note that, while the MQW structure 824 is used as the small Eg layer inside the n-base layer 820 in the present example, the bulk type active layer used in Example 1 may be used. Further, similarly, a quantum dot or the like may be used as a small Eg layer. In this case, it is possible to achieve design to have the advantages of the present invention by replacing the energy difference between the ground levels with the bandgap difference ΔEg by the method described in Example 2. Note that the same applies to other examples without being limited to the present example. Further, in the present example, a barrier layer 8241 and a quantum well layer 8242 forming the MQW structure 824 may be doped.

Further, also in the present example, as described by using FIG. 14 and FIG. 15, when the center position of the small Eg layer is located on the side closer to the anode with respect to the center position of the gate layer, the carrier concentration of the small Eg layer can be increased to realize increase of the light amount. Specifically, in FIG. 8, when the center of the MQW structure 824, which is the small Eg layer, is arranged in a position closer to the anode layer 810 than the center of the n-base layer 820, the light amount can be increased.

Example 5

Figure 12:
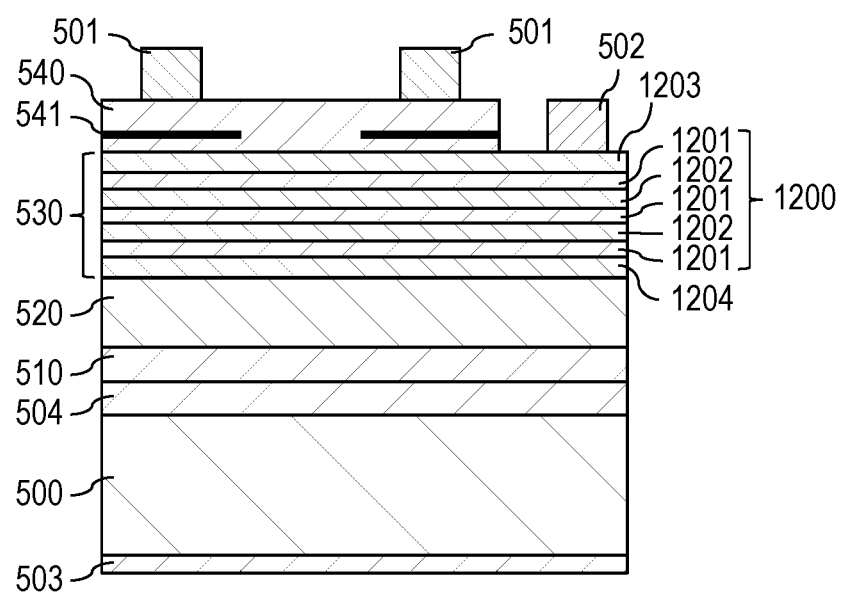
FIG. 12 is a diagram schematically illustrating the structure of a light emitting thyristor of Example 5.

FIG. 12 is an element sectional view of a light emitting thyristor of the present example. In the light emitting thyristor of the present example, an MQW structure 1200 is provided instead of the multi-quantum well (MQW) structure 534 of Example 2. In the following, the description of portions having the same configuration as those of Example 2 will be omitted, and only different portions will be described.

The MQW structure 1200 is structured such that barrier layers 1201 and quantum well layers 1202 are stacked in an alternating manner. In the present example, the MQW structure 1200 is formed of 25 quantum well layers 1202 and 26 barrier layers 1201. The barrier layer 1201 is made of $Al_{0.22}GaAs$. The quantum well layer 1202 is made of $Al_{0.06}GaAs$. The barrier layers 1201 and the quantum well layers 1202 are evenly doped, and the carrier concentration of the barrier layer 1201 and the quantum well layer 1202 is $3 \times 10^{17}$ cm$^{-3}$.

A spacer layer 1203 is made of n-type $Al_{0.22}GaAs$, the thickness thereof is 43 nm, and the carrier concentration thereof is $3 \times 10^{17}$ cm$^{-3}$. A spacer layer 1204 is made of n-type $Al_{0.23}GaAs$, the thickness thereof is 39 nm, and the carrier concentration thereof is $3 \times 10^{17}$ cm$^{-3}$. In this configuration, $\Delta Eg$ is 0.105 eV.

One of the differences between the present example and Example 2 is that the MQW structure 1200 is formed of the doped barrier layers 1201 and quantum well layers 1202. Thereby, even with a large number of, namely, 25 layers of the quantum well layers 1202, the thyristor characteristics can be maintained. With a larger number of the quantum well layers 1202 compared to Example 2, both a further increased light amount and thyristor characteristics can be achieved.

When the MQW structure 1200 is non-doped, the distance d is required to be 50 nm or greater as described above. Although increasing the number of layers of the quantum well layers may be one of the options as a scheme for increasing the light amount while satisfying this condition, it is not preferable to excessively increase the thickness of the n-gate layer in terms of the traveling distance of carriers or the like. Thus, there is an upper limit in the number of layers of the quantum well layers, and increase of the light amount is limited. In the present example, the doped barrier layers 1201 and quantum well layers 1202 are used in the MQW structure 1200, and thereby the construction for the distance d being 50 nm or greater is overcome. Thus, the increased number of the quantum well layers 1202 compared to Example 2 enables further increase in light amount.

Further, since an increase in the number of layers of the quantum well layers 1202 as illustrated in the configuration of the present example enables a reduction in carrier density per layer during light emission, a long-life light emitting thyristor is provided.

Example 6

Figure 18:
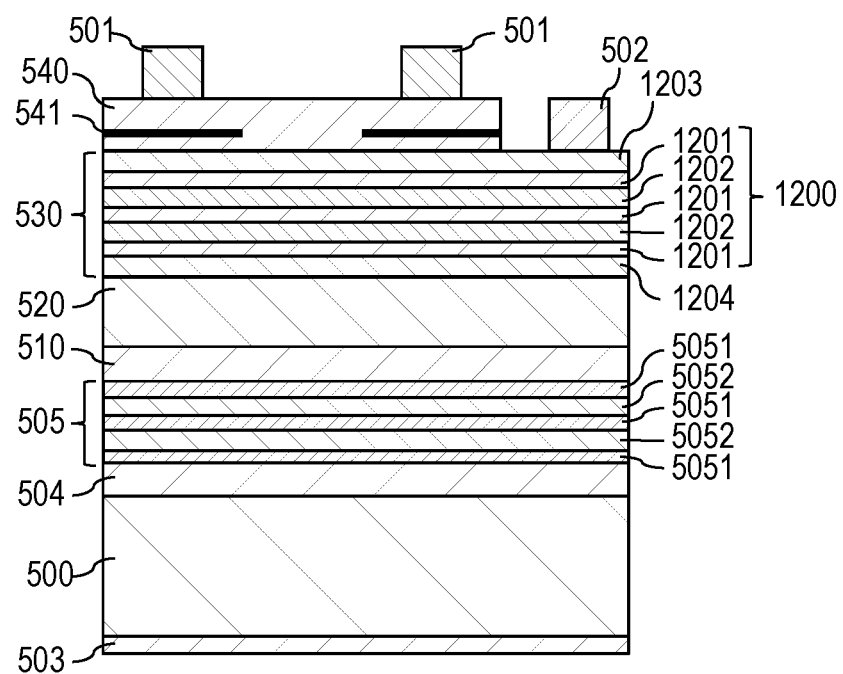
FIG. 18 is a diagram schematically illustrating the structure of the light emitting thyristor of Example 6.

FIG. 18 is an element sectional view of a light emitting thyristor of the present example. In the light emitting thyristor of the present example, the same MQW structure 1200 as Example 5 is provided instead of the MQW structure 534 of Example 3. In other words, the light emitting thyristor of the present example is obtained by the DBR layer 505 of Example 3 being added to the light emitting thyristor of Example 5.

According to the present example, for the same reason as Example 5, it is possible to improve the luminous efficiency while maintaining thyristor characteristics. Further, the DBR layer 505 is added in the present example, it is possible to further improve the luminous efficiency.

Figure 16A:
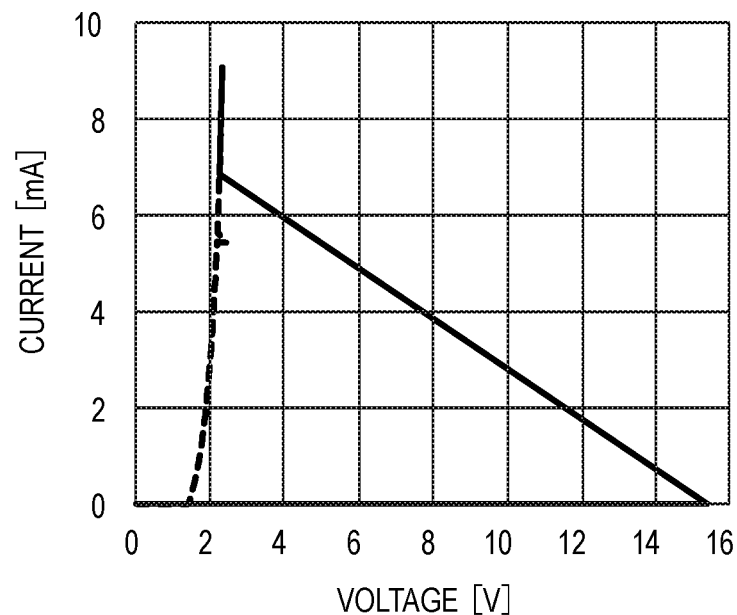
FIG. 16A and FIG. 16B are graphs illustrating I-V curves of light emitting thyristors of Example 6 and Comparative example 3.

FIG. 16A is a graph illustrating the I-V curve of the light emitting thyristor of the present example. The measurement conditions of the I-V curve are the same as those illustrated in Example 3. The solid line in FIG. 16A is an I-V curve of a forward path when measurement is made by gradually increasing the voltage applied between the anode and the cathode from 0 V. The dashed line in FIG. 16A is an I-V curve of a return path when measurement is made by gradually decreasing the application voltage after the light emitting thyristor transfers to "on-state".

As illustrated in FIG. 16A, "on-state" is held from 0 V to a high voltage above 15 V in the measurement of the forward path. Once "on-state" is entered, the "on-state" is held even with a low voltage of around 2.0 V. Further, at a room temperature, the light amount output from the light emitting thyristor when a current of 5.0 mA flows is 330 µW.

Comparative Example 3

Figure 16B:
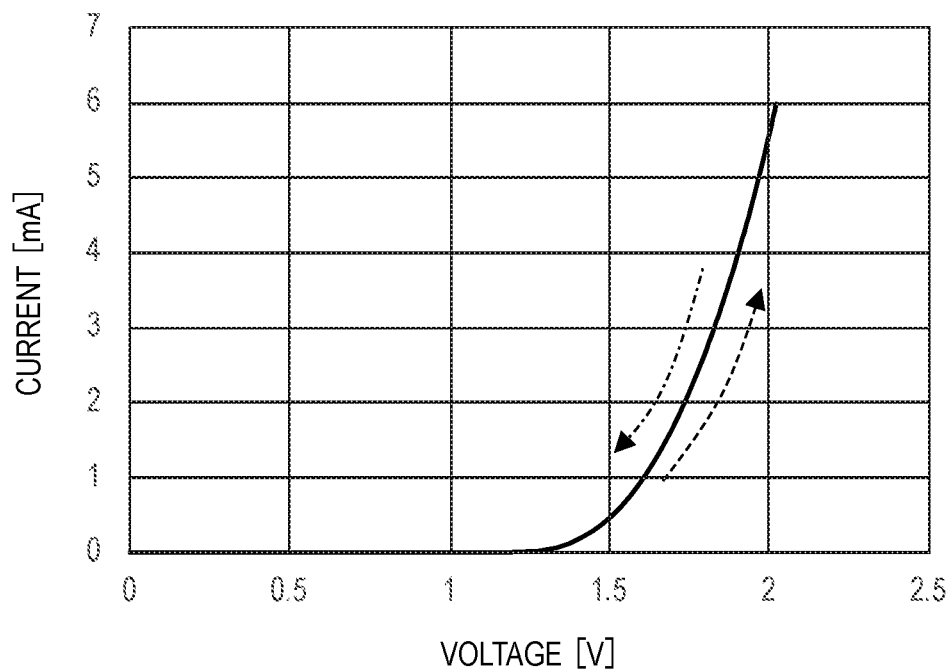

As Comparative example 3 of Example 6, FIG. 16B illustrates an I-V curve of a light emitting thyristor in which the MQW structure 1200 has a doping concentration different from the present example. In this comparative example, the MQW structure 1200 is non-doped. In FIG. 16B, the forward path and the return path overlap with each other. Further, in FIG. 16B, there is no "off-state", a current gradually starts flowing from a low voltage, which does not exhibit thyristor characteristics. In this comparative example, since the MQW structure 1200 is non-doped and the number of layers of the quantum well layers 1202 is 25, the distance d is 39 nm that is smaller than 50 nm. This is a region where "off-state" cannot be held also in the simulation.

Also in the present example, the MQW structure 1200 is formed of the doped barrier layers 1201 and quantum well layers 1202 in the same manner as Example 5. This enables a larger number of layers of the quantum well layers 1202 compared to the case of non-doped, and both a further increased light amount and thyristor characteristics can be achieved. Further, since carrier density per layer at light emission can be reduced, a long-life light emitting thyristor is provided.

Example 7

Figure 13:
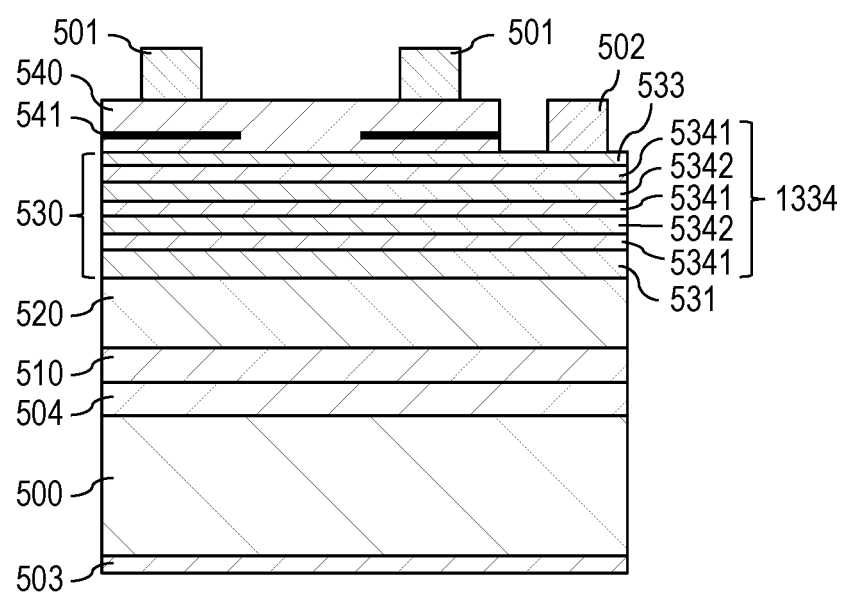
FIG. 13 is a diagram schematically illustrating the structure of a light emitting thyristor of Example 7.

FIG. 13 is an element sectional view of a light emitting thyristor of the present example. The light emitting thyristor of the present example is structured such that the position of the MQW 1334 is closer to the anode layer 540 than in Example 2.

Specifically, the spacer layer 533 is made of the n-type $Al_{0.23}GaAs$, the thickness thereof is 50 nm, and the carrier concentration thereof is $3 \times 10^{17}$ cm$^{-3}$. The spacer layer 531 is made of the n-type $Al_{0.23}GaAs$, the thickness thereof is 150 nm, and the carrier concentration thereof is $3 \times 10^{17}$ cm$^{-3}$.

In the present example, compared to Example 2, the MQW 1334 is located in a position close to the anode layer 540 side where the carrier density is high. Thereby, a light emitting thyristor having a further increased light amount can be provided.

Example 8

The present example is an electrophotography system (image forming device) using the light emitting thyristor of Example 4.

Figure 9A:
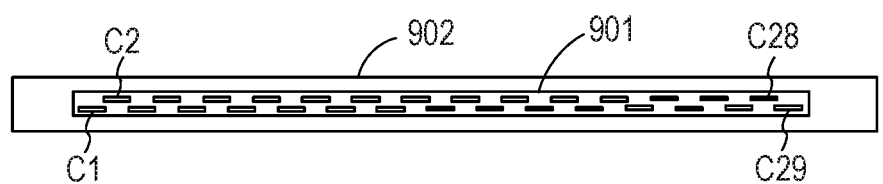
FIG. 9A, FIG. 9B, and FIG. 9C are diagrams schematically illustrating the structure of a printed substrate of Example 8 on which a group of light emitting element array chips are aligned.
Figure 9B:
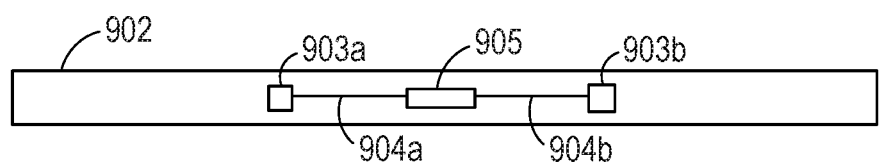
Figure 9C:
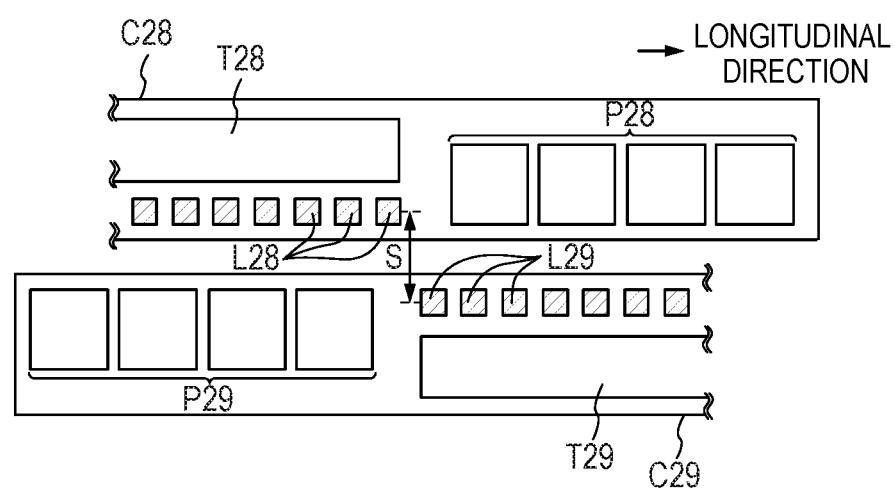

FIG. 9A, FIG. 9B, and FIG. 9C are diagrams schematically illustrating a printed board 902 on which a group of light emitting element array chips 901 is aligned. FIG. 9A is a diagram illustrating a face on which the group of light emitting element array chips 901 is implemented (referred to as "light emitting element array implementation face") of the printed board 902, and FIG. 9B is a diagram illustrating a face opposite to the light emitting element array implementation face (referred to as "light emitting element array non-implementation face").

As illustrated in FIG. 9A, the group of light emitting element array chips 901 is formed of 29 light emitting element array chips C1 to C29 in the present example. The group of light emitting element array chips 901 is implemented on the light emitting element array implementation face of the printed board 902, and the light emitting element array chips C1 to C29 are aligned in a staggered manner on the printed board 902.

Each of the light emitting element array chips C1 to C29 has 516 light emission points and has 516 light emitting thyristors corresponding to the light emission points. Note that each of the light emitting thyristors has the structure of the embodiment or each example described above. In each of the light emitting element array chips C1 to C29, 516 light emitting thyristors are one-dimensionally aligned in the longitudinal direction of the chip at a predetermined pitch, adjacent light emitting thyristors are separated by an element isolation groove. That is, the light emitting element array chips C1 to C29 can be referred to as a light emitting thyristor array in which a plurality of light emitting thyristors are one-dimensionally aligned. In the present example, the pitch between adjacent light emitting thyristors is 21.16 μm, which corresponds to the pitch of a resolution of 1200 dpi. Further, the distance between ends of 516 light emission points within a chip is around 10.9 mm (≈21.16 μm×516).

As illustrated in FIG. 9B, a drive unit 903a that drives the light emitting element array chips C1 to C15 and a drive unit 903b that drives the light emitting element array chips C16 to C29 are arranged on both sides of a connector 905 on the light emitting element array non-implementation face. Signal lines used for controlling the drive units 903a and 903b from an image controller unit (not illustrated), a power line, and a ground line are connected to the connector 905, and thereby the drive units 903a and 903b are connected thereto. Wirings used for driving light emitting element array chips pass through an inner layer of the printed board 902 from the drive units 903a and 903b and connected to the light emitting element array chips C1 to C15 and the light emitting element array chips C16 to C29, respectively.

The light emitting element array chips C1 to C29 are arranged in two columns in a staggered manner, and each column is arranged in the longitudinal direction of the printed board 902. FIG. 9C illustrates a view of the boundary between chips of the light emitting element array chip C28 and the light emitting element array chip C29. A wire bonding pad P used for inputting a control signal is arranged to the end of each light emitting element array chip. A transfer unit T and a light emitting thyristor L are driven by a signal input from the wire bonding pad P. Also at the boundary between chips, the pitch between adjacent light emitting thyristors in the longitudinal direction of the printed board 902 is 21.16 μm corresponding to the pitch for the resolution of 1200 dpi. Further, the pitch in the short direction of the printed board 902 between the light emission points of the chips on the two columns (S in FIG. 9C) is around 84 μm (for four pixels at 1200 dpi, eight pixels at 2400 dpi).

Since 29 light emitting element array chips having 516 light emission points per chip are aligned on the printed board 902, the number of light emitting thyristors to be able to emit light is 14,964 in the entire group of light emitting element array chips 901. Further, the width that can be exposed by the group of light emitting element array chips 901 of the present example is around 316 mm (≈10.9 mm×29), and with a use of an exposure head on which the group of light emitting element array chips 901 is mounted, an image corresponding to this width can be formed.

Next, an exposure head 306 on which the group of light emitting element array chips 901 is mounted will be described.

The exposure head 306 of the present example can perform exposure on a photosensitive drum 302 and can be preferably used when forming an electrostatic latent image on the photosensitive drum. However, the application of the exposure head 306 is not limited in particular but can also be used as a light source of a line scanner, for example.

The exposure head 306 has the group of light emitting element array chips 901 described above, the printed board 902 on which the group of light emitting element array chips 901 is implemented, and a rod lens array 403. Further, the exposure head 306 has a housing (support member) 404 that support the rod lens array 403 and the printed board 902.

The rod lens array 403 is an optical system that collects a light from the group of light emitting element array chips 901. The exposure head 306 collects, at the rod lens array 403, a light from each light emitting thyristor in the group of light emitting element array chips 901. The light collected by the rod lens array 403 is emitted to the photosensitive drum 302.

Figure 10A:
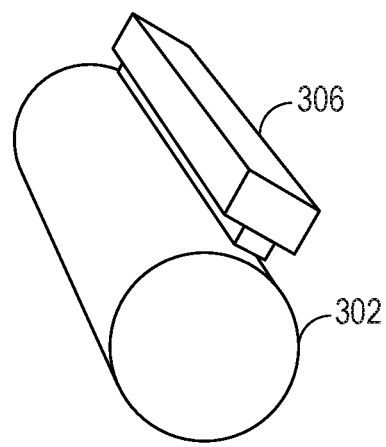
FIG. 10A and FIG. 10B are diagrams illustrating a configuration of an exposure head of Example 8.
Figure 10B:
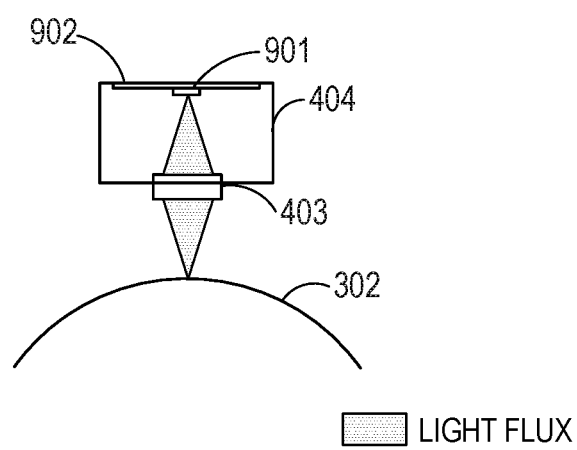

FIG. 10A and FIG. 10B illustrates an arrangement of the photosensitive drum 302 and the exposure head 306 and a view where a light from the exposure head 306 is captured on the surface of the photosensitive drum 302. The exposure head 306 is arranged to face the photosensitive drum 302. Each of the exposure head 306 and the photosensitive drum 302 is attached to the image forming device by using an attachment member (not illustrated) for use.

It is preferable that the exposure head 306 be assembled and adjusted alone in the factory and a focus adjustment or a light amount adjustment at each spot be performed so that a light convergence position is located at a suitable position when attached to the image forming device. Here, the distance between the photosensitive drum 302 and the rod lens array 403 and the distance between the rod lens array 403 and the group of light emitting element array chips 901 are arranged to have a predetermined spacing. Thereby, the light from the exposure head 306 is captured on the photosensitive drum 302. Thus, the attachment position of the rod lens array 403 is adjusted in focus adjustment so that the distance between the rod lens array 403 and the group of light emitting element array chips 901 becomes a predetermined value. Further, in light amount adjustment, respective light emitting thyristors are sequentially caused to emit light, and a drive current of each light emitting element is adjusted so that a light collected via the rod lens array 403 becomes a predetermined light amount.

Figure 11:
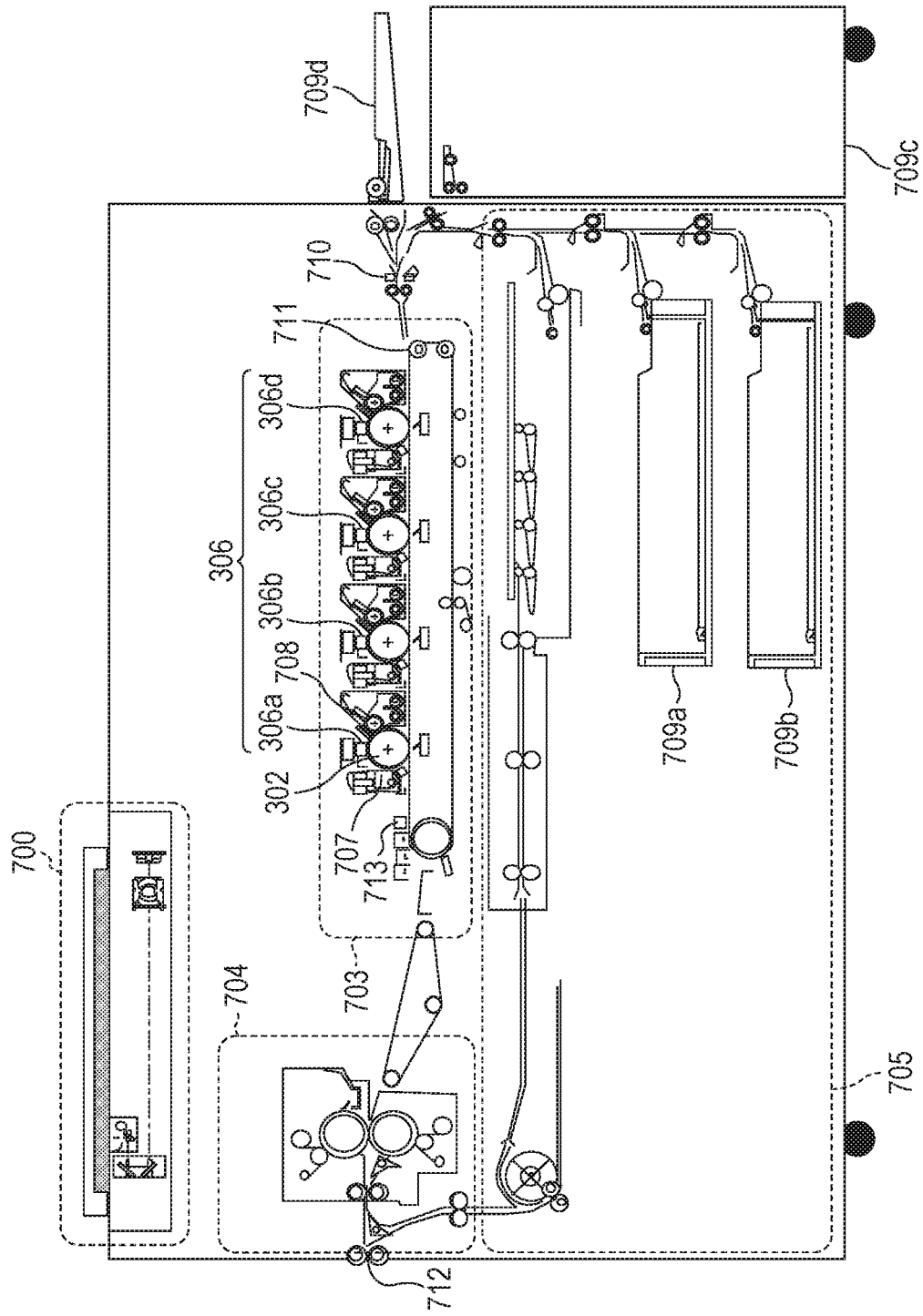
FIG. 11 is a diagram illustrating a configuration of an image forming device of Example 8.

Next, an image forming device using the exposure head 306 will be described with reference to FIG. 11. FIG. 11 is a diagram illustrating a configuration of the image forming device of the present example.

The image forming device of the present example is an electrophotography image forming device and has a scanner unit 700, an image forming unit 703, a fixing unit 704, a paper feed/transport unit 705, and a control unit (not illustrated) that controls these units.

The scanner unit 700 irradiates a document to be read with a light and optically reads an image of the document. An image read by the scanner unit 700 is converted into an electric signal, and thereby image data is generated.

The image forming unit 703 has a plurality of development units that perform development by using electrophotography process, each development unit has the photosensitive drum 302, the exposure head 306, a charging device 707, and a development device 708. The development unit may be a process cartridge that accommodates a configuration used for development of a toner image. In this case, the process cartridge is preferably removable to the main unit of the image forming device.

The photosensitive drum 302 is an image carrier on which an electrostatic latent image is formed. The photosensitive drum 302 is rotary-driven and charged by the charging device 707.

The exposure head 306 irradiates the photosensitive drum 302 with a light in accordance with image data and forms an electrostatic latent image on the photosensitive drum 302. Specifically, the exposure head 306 collects light generated from the chip surface of the group of light emitting element array chips 901 on the photosensitive drum 302 by using the rod lens array 403 and forms an electrostatic latent image in accordance with image data on the photosensitive drum 302.

The development device 708 supplies toner (development agent) to the electrostatic latent image formed on the photosensitive drum 302 for development. Toner is accommodated in an accommodation unit. The accommodation unit that accommodates toner is preferably included in the development unit. The developed toner image (development agent image) is transferred on a recording medium such as a sheet transported on the transfer belt 711.

The image forming device of the present embodiment has four development units (development stations) that perform development using such a series of electrophotography process and transfers a toner image from each development unit to form a desired image. Four development units have toner of respective different colors and sequentially perform imaging operations for magenta, yellow, and black after a predetermined time period has elapsed from the start of imaging with cyan.

The paper feed/transport unit 705 feeds a sheet from a paper feed unit instructed in advance out of internal paper feed units 709a and 709b, an external paper feed unit 709c, and a manual paper feed unit 709d, and the fed sheet is transported to a registration roller 710.

The registration roller 710 transports a sheet on the transfer belt 711 so that a toner image formed in the image forming unit 703 described above is transferred on the sheet.

The optical sensor 713 is arranged so as to face the surface on which the toner image of the transfer belt 711 is transferred and performs position detection of a test chart printed on the transfer belt 711 in order to calculate a color shift amount between respective development units. The color shift amount calculated here is transmitted to an image controller unit (not illustrated) and used for correction of image position of each color. This control allows a full-color toner image without a color shift to be transferred on a sheet.

The fixing unit 704 incorporates a plurality of rollers and a heat source such as a halogen heater, dissolves and fixes toner on the sheet, in which the toner image is transferred from the transfer belt 711, by using heat and pressure, and feeds out the sheet by using an ejection roller 712 to the outside of the image forming device.

An image forming control unit (not illustrated) is connected to a multifunction printer (MFP) control unit that controls the entire MFP including the image forming device, and the image forming control unit performs control in accordance with an instruction from the MFP control unit. Further, the image forming control unit performs instruction so that the entire device can smoothly operate with harmony being maintained as a whole while managing states of the scanner unit 700, the imaging unit 703, the fixing unit 704, and the sheet feed/transport unit 705 described above.

In such an image forming device using an exposure head, the number of components to be used is less than an image forming device with a laser scanning scheme that performs deflection scanning of a laser beam by using a polygon motor, and it is therefore easier to reduce size and cost of the device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-172341, filed Sep. 7, 2017, and Japanese Patent Application No. 2018-136477, filed Jul. 20, 2018 which are hereby incorporated by reference herein in their entirety.

What is claimed is:

1. A light emitting thyristor comprising a stack structure including, on a semiconductor substrate of a first conductivity type, a first semiconductor layer of the first conductivity type, a second semiconductor layer of a second conductivity type that is different from the first conductivity type, a third semiconductor layer at least a part of which is the first conductivity type, and a fourth semiconductor layer of the second conductivity type in this order,
  wherein the third semiconductor layer comprises a plurality of semiconductor layers and includes at least a fifth semiconductor layer of the first conductivity type in contact with the second semiconductor layer and a sixth semiconductor layer including the first conductivity type or i-type in this order from the semiconductor substrate side,
  wherein the sixth semiconductor layer is a layer having the smallest bandgap in all the layers forming the stack structure, and
  wherein a difference ΔEg between a bandgap of the fifth semiconductor layer and a bandgap of the sixth semiconductor layer is greater than or equal to 0.05 eV and less than or equal to 0.15 eV.

2. The light emitting thyristor according to claim 1, wherein a distance d between the second semiconductor layer and the sixth semiconductor layer is larger than a thickness of a portion occurring inside the third semiconductor layer of a depletion layer occurring at an interface between the second semiconductor layer and the third semiconductor layer in a state where a drive voltage of the light emitting thyristor is applied between the first semiconductor layer and the fourth semiconductor layer of the light emitting thyristor in an off-state.

3. The light emitting thyristor according to claim 1, wherein a drive voltage applied between the first semiconductor layer and the fourth semiconductor layer is less than or equal to 2.5 V.

4. The light emitting thyristor according to claim 1, wherein a distance d between the second semiconductor layer and the sixth semiconductor layer is greater than or equal to 70 nm.

5. The light emitting thyristor according to claim 1, wherein a distance d between the second semiconductor layer and the sixth semiconductor layer is less than or equal to 200 nm.

6. The light emitting thyristor according to claim 1 further comprising a seventh semiconductor layer of the first conductivity type between the sixth semiconductor layer and the fourth semiconductor layer.

7. The light emitting thyristor according to claim 1, wherein the center of the sixth semiconductor layer is located in a position closer to the fourth semiconductor layer than the center of the third semiconductor layer.

8. The light emitting thyristor according to claim 1, wherein the first conductivity type is n-type, and the second conductivity type is p-type.

9. The light emitting thyristor according to claim 1, wherein the first conductivity type is p-type, and the second conductivity type is n-type.

10. The light emitting thyristor according to claim 1, wherein the sixth semiconductor layer forms a well layer of multi-quantum well structure.

11. The light emitting thyristor according to claim 1, wherein the second semiconductor layer and the third semiconductor layer include AlGaAs based material.

12. A light emitting thyristor array comprising a plurality of light emitting thyristors according to claim 1, wherein the plurality of light emitting thyristors are one-dimensionally aligned.

13. An image forming device comprising:
an image carrier;
a charging unit configured to charge a surface of the image carrier;
an exposure head configured to expose the surface of the image carrier charged by the charging unit and form an electrostatic latent image on the surface of the image carrier;
a development unit configured to develop the electrostatic latent image formed by the exposure head; and
a transfer unit configured to transfer, on a recording medium, an image developed by the development unit,
wherein the exposure head has the light emitting thyristor array according to claim 12.

14. A light emitting thyristor comprising a stack structure including, on a semiconductor substrate of a first conductivity type, a first semiconductor layer of the first conductivity type, a second semiconductor layer at least a part of which is a second conductivity type that is different from the first conductivity type, a third semiconductor layer of the first conductivity type, and a fourth semiconductor layer of the second conductivity type in this order,
wherein the second semiconductor layer comprises a plurality of semiconductor layers and includes at least a fifth semiconductor layer of the second conductivity type in contact with the third semiconductor layer and a sixth semiconductor layer including the second conductivity type or i-type in this order from the opposite side of the semiconductor substrate,
wherein the sixth semiconductor layer is a layer having the smallest bandgap in all the layers forming the stack structure, and
wherein a difference ΔEg between a bandgap of the fifth semiconductor layer and a bandgap of the sixth semiconductor layer is greater than or equal to 0.05 eV and less than or equal to 0.15 eV.

15. The light emitting thyristor according to claim 14, wherein a distance d between the third semiconductor layer and the sixth semiconductor layer is larger than a thickness of a portion occurring inside the second semiconductor layer of a depletion layer occurring at an interface between the third semiconductor layer and the second semiconductor layer in a state where a drive voltage of the light emitting thyristor is applied between the first semiconductor layer and the fourth semiconductor layer of the light emitting thyristor in an off-state.

16. The light emitting thyristor according to claim 14, wherein a drive voltage applied between the first semiconductor layer and the fourth semiconductor layer is less than or equal to 2.5 V.

17. The light emitting thyristor according to claim 14, wherein a distance d between the third semiconductor layer and the sixth semiconductor layer is greater than or equal to 70 nm.

18. The light emitting thyristor according to claim 14, wherein a distance d between the third semiconductor layer and the sixth semiconductor layer is less than or equal to 200 nm.

19. The light emitting thyristor according to claim 14 further comprising a seventh semiconductor layer of the second conductivity type between the sixth semiconductor layer and the first semiconductor layer.

20. The light emitting thyristor according to claim 14, wherein the center of the sixth semiconductor layer is located in a position closer to the first semiconductor layer than the center of the second semiconductor layer.

* * * * *